(12) United States Patent
Heo et al.

(10) Patent No.: US 12,174,664 B2
(45) Date of Patent: Dec. 24, 2024

(54) DISPLAY DEVICE AND MANUFACTURING METHOD OF WINDOW

(71) Applicant: Samsung Display Co., Ltd., Yongin-si (KR)

(72) Inventors: Jinnyoung Heo, Yongin-si (KR); Kyu Young Kim, Suwon-si (KR); Hansun Ryou, Seoul (KR); Seungyo Yang, Suwon-si (KR); Jiin Yoon, Asan-si (KR); Kyungeun Lee, Incheon (KR); Seoyoung Jang, Hwaseong-si (KR); Jae Hoon Jeong, Bucheon-si (KR); Suyeon Cha, Bucheon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 500 days.

(21) Appl. No.: 17/241,477

(22) Filed: Apr. 27, 2021

(65) Prior Publication Data
US 2022/0035409 A1 Feb. 3, 2022

(30) Foreign Application Priority Data
Jul. 28, 2020 (KR) ........................ 10-2020-0093617

(51) Int. Cl.
*B32B 3/10* (2006.01)
*B32B 17/10* (2006.01)
(Continued)

(52) U.S. Cl.
CPC ............ *G06F 1/1652* (2013.01); *B32B 17/10* (2013.01); *B32B 27/20* (2013.01); *B32B 27/36* (2013.01);
(Continued)

(58) Field of Classification Search
None
See application file for complete search history.

(56) References Cited

U.S. PATENT DOCUMENTS

| 9,985,246 B2 | 5/2018 | Jeong et al. |
| 10,003,044 B2 | 6/2018 | Nam et al. |

(Continued)

FOREIGN PATENT DOCUMENTS

| CN | 111131563 A | * | 5/2020 |
| KR | 10-2006-0088520 | | 8/2006 |

(Continued)

OTHER PUBLICATIONS

Machine translation of KR-2017001102-A (Year: 2017).*
(Continued)

*Primary Examiner* — Christopher M Polley
(74) *Attorney, Agent, or Firm* — KILE PARK REED & HOUTTEMAN PLLC

(57) ABSTRACT

A display device includes a display module, and a window which is disposed on the display module and in which a first non-folding region, a folding region, and a second non-folding region are sequentially defined in a first direction, wherein the window includes a base layer, a first hard coating layer disposed on an upper surface of the base layer, and a second hard coating layer disposed on a lower surface of the base layer, and the second hard coating layer includes a first portion overlapping the first non-folding region and the second non-folding region of the window, and a second portion overlapping the folding region of the window and having a hardness lower than a hardness of the first portion. Therefore, it is possible to provide a display device having desired surface hardness, impact resistance, and bending properties.

21 Claims, 14 Drawing Sheets

(51) Int. Cl.
    *B32B 27/20*     (2006.01)
    *B32B 27/36*     (2006.01)
    *B32B 27/40*     (2006.01)
    *B32B 27/42*     (2006.01)
    *G02B 1/04*     (2006.01)
    *G02B 1/14*     (2015.01)
    *G06F 1/16*     (2006.01)

(52) U.S. Cl.
    CPC .............. *B32B 27/40* (2013.01); *B32B 27/42* (2013.01); *G02B 1/04* (2013.01); *G02B 1/14* (2015.01); *B32B 2255/26* (2013.01); *B32B 2255/28* (2013.01); *B32B 2307/51* (2013.01); *B32B 2457/20* (2013.01); *B32B 2457/206* (2013.01); *B32B 2457/208* (2013.01)

(56) References Cited

U.S. PATENT DOCUMENTS

| | | | |
|---|---|---|---|
| 10,416,721 | B2 | 9/2019 | Shin et al. |
| 2014/0287213 | A1 | 9/2014 | Lee et al. |
| 2016/0270210 | A1* | 9/2016 | Shin ................. G02B 1/14 |
| 2017/0064845 | A1* | 3/2017 | Jung ................. H05K 1/028 |
| 2017/0179424 | A1 | 6/2017 | Lee et al. |
| 2019/0061318 | A1 | 2/2019 | Jung et al. |
| 2019/0350092 | A1 | 11/2019 | Jung et al. |
| 2020/0095161 | A1 | 3/2020 | Jeong et al. |

FOREIGN PATENT DOCUMENTS

| | | | |
|---|---|---|---|
| KR | 10-2008-0073061 | 8/2008 | |
| KR | 10-2015-0033461 | 4/2015 | |
| KR | 10-2016-0006585 | 1/2016 | |
| KR | 10-2016-0086514 | 7/2016 | |
| KR | 10-2017-0001102 | 1/2017 | |
| KR | 2017001102 A * | 1/2017 | ............... C08J 7/04 |
| KR | 10-2017-0093610 | 8/2017 | |
| KR | 10-1922993 | 11/2018 | |
| KR | 10-1948655 | 2/2019 | |
| KR | 10-2020-0024810 | 3/2020 | |

OTHER PUBLICATIONS

Machine translation of CN-111131563-A (Year: 2020).*
Extended European search report for European Patent Application or Patent No. 21184204.2 dated Dec. 14, 2021.

* cited by examiner

DISPLAY DEVICE AND MANUFACTURING METHOD OF WINDOW

CROSS-REFERENCE TO RELATED APPLICATION(S)

This U.S. non-provisional patent application claims priority to and the benefit of Korean Patent Application No. 10-2020-0093617 under 35 U.S.C. § 119, filed in the Korean Intellectual Property Office (KIPO) on Jul. 28, 2020, the entire contents of which are incorporated herein by reference.

BACKGROUND

The disclosure relates to a display device and a method for manufacturing a window included therein, and more specifically, to a display device having improved folding properties, high surface hardness, and impact resistance, and a method for manufacturing a window included therein.

A display device, such as a television, a monitor, a smart phone, and a tablet, providing an image to a user includes a display panel for displaying the image. Various display panels, such as a liquid crystal display panel, an organic light emitting display panel, an electro wetting display panel, and an electrophoretic display panel, are being developed as the display panel.

With the recent development of display device technology, a display device including a flexible display panel is being developed. A window member used in a flexible display device should have not only impact resistance such as surface hardness or strength but also flexibility to prevent deformation when bent or folded.

SUMMARY

The disclosure provides a display device having improved reliability and durability.

The disclosure also provides a method for manufacturing a window member including a hard coating layer which has high surface hardness and desired bending properties.

An embodiment provides a display device including a display module and a window which is disposed on the display module and in which a first non-folding region, a folding region, and a second non-folding region are sequentially defined in a first direction. The window may include a base layer, a first hard coating layer disposed on an upper surface of the base layer, and a second hard coating layer disposed on a lower surface of the base layer. The second hard coating layer may include a first portion overlapping the first non-folding region and the second non-folding region of the window, and a second portion overlapping the folding region of the window and having a hardness lower than a hardness of the first portion.

In an embodiment, the second portion of the window may include a highly-stretchable polymer material.

In an embodiment, the second portion of the window may include at least one of a urea-based material, a urethane-based material, an ester-based material, or an epoxy-based material.

In an embodiment, the second portion of the window may include a filler.

In an embodiment, the window may include a third hard coating layer disposed on a side surface of the base layer.

In an embodiment, the base layer may include glass or tempered glass, and the base layer may have a thickness in a range of about 20 μm to about 40 μm.

In an embodiment, a thickness of the first hard coating layer may be in a range of about 5 μm to about 15 μm, and a thickness of the second hard coating layer may be in a range of about 10 μm to about 40 μm.

In an embodiment, each of the first hard coating layer and the second hard coating layer may include a siloxane compound.

In an embodiment, each of the first hard coating layer and the second hard coating layer may have a refractive index in a range of about 1.3 to about 1.6.

In an embodiment, the window may be fordable with respect to a folding axis extending in a second direction intersecting the first direction.

In an embodiment, the display device may further include a protection layer disposed on the window.

In an embodiment, a display device may include a display module, and a window which is disposed on the display module and in which a first non-folding region, a folding region, and a second non-folding region are sequentially defined in a first direction. The window may include a base layer, and a lower hard coating layer disposed between the base layer and the display module. The lower hard coating layer may include a first portion overlapping the first non-folding region and the second non-folding region of the window, and a second portion overlapping the folding region of the window, the second portion including a highly-stretchable polymer material selected from the group consisting of polyurea, polyurethane, and polyester.

In an embodiment, the window may include an upper hard coating layer spaced apart from the lower hard coating layer, the base layer may be disposed between the upper hard coating layer and the lower hard coating layer, and each of the upper hard coating layer and the lower hard coating layer may include a siloxane compound.

In an embodiment, the second portion of the lower hard coating layer may include a first binder including the siloxane compound; a second binder including the highly-stretchable polymer material; and a filler.

In an embodiment, a method for manufacturing a window may include preparing a base layer in which a first region, a second region, and a third region are sequentially defined in a first direction, forming a first hard coating layer by applying a first hard coating material onto an upper surface of the base layer, and forming a second hard coating layer on a lower surface of the base layer. The forming of the second hard coating layer may include applying the first hard coating material onto the first region and the third region of the base layer to form a first portion, and applying a second hard coating material including a highly-stretchable polymer material onto the second region of the base layer to form a second portion.

In an embodiment, the applying of the first hard coating material and the applying of the second hard coating material may be performed by a single process.

In an embodiment, the applying of the second hard coating material may include, after the applying of the first hard coating material and the applying of the second hard coating material, curing the applied first hard coating material and the applied second hard coating material.

In an embodiment, the highly-stretchable polymer material may include at least one of polyurea, polyurethane, or polyester.

In an embodiment, a solid content of the second hard coating material may be about 20 wt % to about 45 wt %.

In an embodiment, each of the first hard coating material and the second hard coating material may include at least one of an anti-foaming agent or a planarization agent.

BRIEF DESCRIPTION OF THE DRAWINGS

The accompanying drawings are included to provide a further understanding of the disclosure and are incorporated in and constitute a part of this specification. The drawings illustrate some embodiments of the disclosure and, together with the description, serve to explain principles of the disclosure. In the drawings.

DETAILED DESCRIPTION OF THE EMBODIMENTS

Figure 1:
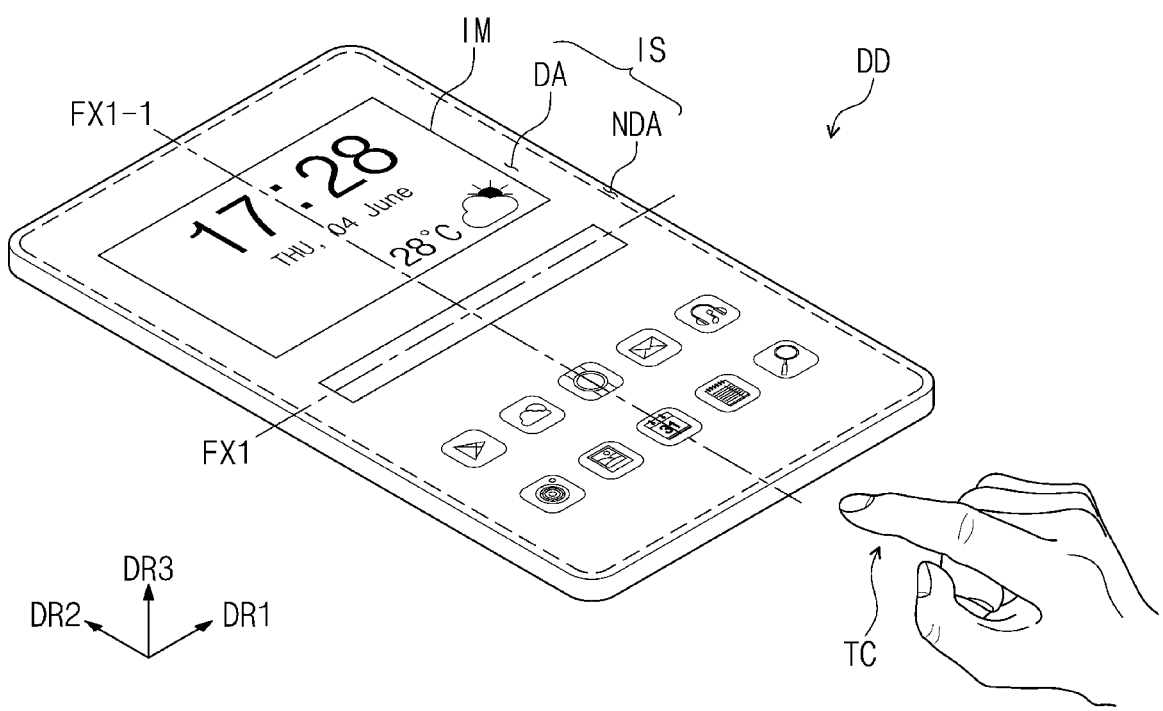
FIG. 1 is a schematic perspective view of a display device according to an embodiment.

Hereinafter, some embodiments of the disclosure will be described with reference to the accompanying drawings.

In the disclosure, when an element (or an area, a layer, a portion, etc.) is referred to as being "on," "connected to," or "coupled to" another element, it means that the element may be directly connected to/coupled to the other element, or that a third element may be disposed therebetween.

Like reference numerals refer to like elements. Also, in the drawings, the thickness, the ratio, and the dimensions of elements may be exaggerated for an effective description of technical contents. The term "and/or" includes all combinations of one or more of which associated configurations may define.

It will be understood that, although the terms "first," "second," or the like may be used herein to describe various elements, these elements should not be limited by these terms. These terms are only used to distinguish one element from another. For example, a first element could be termed a second element, and, similarly, a second element could be termed a first element, without departing from the scope of example embodiments of the disclosure. The terms of a singular form may include plural forms unless the context clearly indicates otherwise.

Terms such as "below," "lower," "above," "upper," and the like are used to describe the relationship of the configurations shown in the drawings. The terms are used as a relative concept and are described with reference to the direction indicated in the drawings.

It should be understood that the terms "comprise," "include," or "have" are intended to specify the presence of stated features, integers, steps, operations, elements, components, or combinations thereof in the disclosure, but do not preclude the presence or addition of one or more other features, integers, steps, operations, elements, components, or combinations thereof.

In the disclosure, being "directly disposed" may mean that there is no layer, film, region, plate, or the like added between a portion of a layer, a film, a region, a plate, or the like and other portions. For example, being "directly disposed" may mean being disposed without additional members such as an adhesive member between two layers or two members.

Unless otherwise defined or implied herein, all terms (including technical and scientific terms) used herein have the same meaning as commonly understood by those skilled in the art to which the disclosure pertains. It is also to be understood that terms, such as those defined in commonly used dictionaries, should be interpreted as having meanings consistent with the meanings in the context of the related art and the disclosure, and should not be limited unless they are interpreted in an ideal or excessively formal sense unless clearly defined herein.

Hereinafter, a display device, a window included in the display device, and a method for manufacturing the window all according to an embodiment will be described.

FIG. 1 is a schematic perspective view of a display device according to an embodiment.

Referring to FIG. 1, a display device DD may have a rectangular shape which has short sides extending in a first direction DR1 and long sides extending in a second direction DR2 intersecting the first direction DR1. However, the shape of the display device DD is not limited thereto. The display device DD of various shapes may be provided.

The display device DD may be a foldable electronic apparatus. Specifically, the display device DD according to an embodiment may be foldable on the basis of folding axes FX1 and FX1-1 extending in a predetermined direction. Hereinafter, a state of being folded on the basis of the folding axes FX1 and FX1-1 may be defined as a folded state, and a state of not being folded may be defined as a non-folded state. The folding axes FX1 and FX1-1 may be rotating axes created in case that the display device DD is folded and may be formed by a mechanical structure of the display device DD.

Each of the folding axes FX1 and FX1-1 may extend in the first direction DR1 or in the second direction DR2. In an embodiment, a folding axis extending in the first direction DR1 may be defined as a first folding axis FX1, and a folding axis extending in the second direction DR2 may be defined as a second folding axis FX1-1. The display device DD may include a folding axis of the first and second folding axes FX1 and FX1-1. For example, the display device DD may be folded on the basis of a folding axis of the first and second folding axes FX1 and FX1-1.

The display device DD according to the disclosure may be a large-sized display device such as a television and a monitor and a small-and-medium-sized display device such as a mobile phone, a tablet computer, a car navigation system, and a game console. It should be understood that these devices are merely examples, and the display device DD may be employed in other electronic devices without departing from the scope of the disclosure.

As illustrated in FIG. 1, the display device DD may display an image IM in a third direction DR3 on a display surface IS parallel to each of the first direction DR1 and the second direction DR2. The display surface IS on which the image IM is displayed may correspond to a front surface of the display device DD. Hereinafter, the third direction DR3 in which the display surface IS displays the image IM may be defined as a thickness direction of the display device DD and of each component included in the display device DD.

The display surface IS of the display device DD may be divided into regions. The display surface IS of the display device DD may have a display region DA and a non-display region NDA defined thereon.

The display region DA may be a region in which the image IM is displayed, and a user may visually recognize the image IM through the display region DA. The display region DA may have a quadrangular shape. The non-display region NDA may surround the display region DA. Accordingly, the shape of the display region DA may be defined by the non-display region NDA. However, this is only an example. The non-display region NDA may be disposed adjacent to only a side of the display region DA or may be omitted. The display device DD according to an embodiment may include various embodiments and is not limited to an embodiment.

The non-display region NDA is a region adjacent to the display region DA in which the image IM is not displayed. A bezel region of the display device DD may be defined by the non-display region NDA.

The display device DD according to the disclosure may sense a user input TC applied from the outside. The user input TC may include external inputs in various forms such as a part of a user's body, light, heat, or pressure. In an embodiment, the user input TC is illustrated as a user's hand applied to the front surface. However, this is only an example. As described above, the user input TC may be provided in various forms, and the display device DD may also sense the user input TC applied to a side surface or a back surface of the display device DD depending on the structure of the display device DD but is not limited to any one embodiment.

The display device DD may activate the display surface IS to display the image IM and may sense the user input TC. In an embodiment, a region in which the user input TC is sensed is illustrated as being provided in the display region DA in which the image IM is displayed. However, this is only an example. The region in which the user input TC is sensed may be provided in the non-display region NDA or in every region of the display surface IS.

Figure 2A:
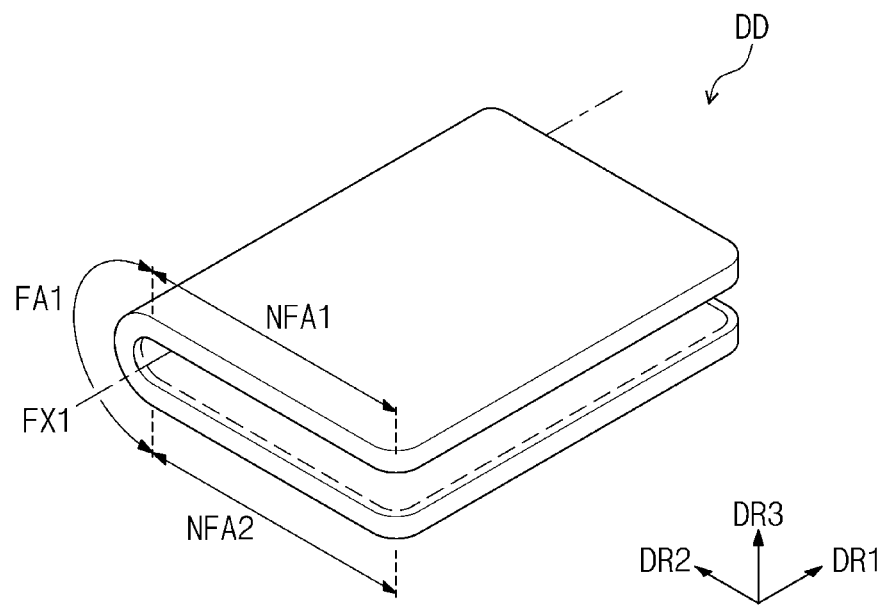
FIG. 2A and FIG. 2B are schematic perspective views of a folded state of a display device according to an embodiment.
Figure 2B:
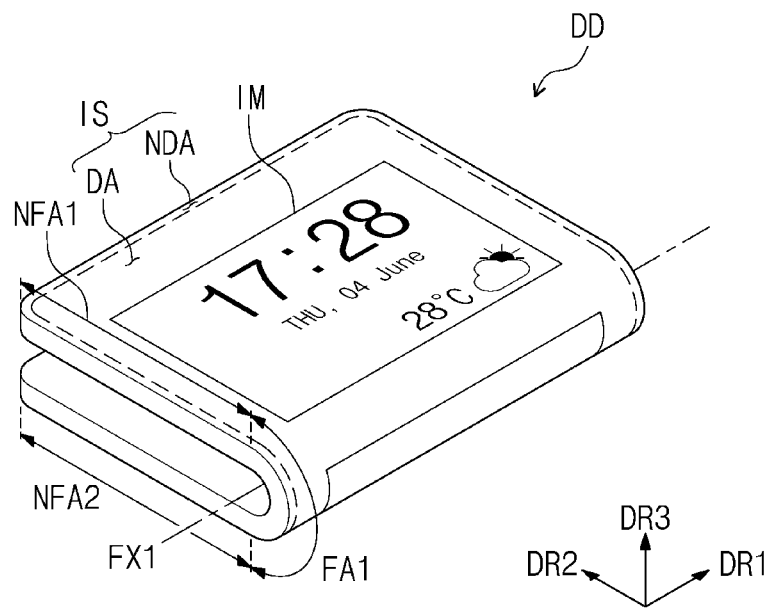

FIGS. 2A and 2B are schematic perspective views of a folded state of a display device according to an embodiment. FIG. 2A is a view illustrating that the display device DD illustrated in FIG. 1 is in-folded along the first folding axis FX1, and FIG. 2B is a view illustrating that the display device DD illustrated in FIG. 1 is out-folded along the first folding axis FX1.

Referring to FIGS. 1 and 2A, the display device DD may be a foldable display device. The display device DD may be folded with respect to a folding axis (for example, the first folding axis FX1 and the second folding axis FX1-1) extending in a predetermined direction.

The display device DD may include regions depending on an operation type. The regions may be divided into a folding region FA1 and one or more non-folding regions NFA1 and NFA2. The folding region FA1 may be defined between two non-folding regions NFA1 and NFA2.

The folding region FA1 may be a region folded with respect to the first folding axis FX1 and may be a region which substantially forms a curvature. Here, the first folding axis FX1 may extend in the first direction DR1, for example, a short axis direction of the display device DD. The folding region FA1 may be folded along the first folding axis FX1 and may be defined as a region extending in the first direction DR1.

As an example, the non-folding regions NFA1 and NFA2 may include a first non-folding region NFA1 and a second non-folding region NFA2. The first non-folding region NFA1 may be adjacent to a side of the folding region FA1 in the second direction DR2, and the second non-folding region NFA2 may be adjacent to the other side of the folding region FA1 in the second direction DR2. The first non-folding region NFA1, the folding region FA1, and the second non-folding region NFA2 may be sequentially arranged in the second direction DR2.

The display device DD may be in-folded or out-folded. In the disclosure, being in-folded may refer that the display surface IS is folded to face each other, and being out-folded may refer that a rear surface of the display device DD is folded to face each other. In other words, being in-folded may refer that display surfaces of the non-folding regions NFA1 and NFA2 which are different from each other are folded to face each other, and being out-folded may refer that display surfaces of the non-folding regions NFA1 and NFA2 which are different from each other are folded to face the outside.

The display device DD illustrated in FIG. 2A may be in-folded such that the first non-folding region NFA1 of the display surface IS and the second non-folding region NFA2 of the display surface IS face each other. In case that the first non-folding region NFA1 is rotated in the clockwise direction about the first folding axis FX1, the display device DD may be in-folded. In order to allow the display device DD to be in-folded such that the first non-folding region NFA1 and the second non-folding region NFA2 are aligned, the first folding axis FX1 may be defined in a central portion of the display device DD in the second direction DR2.

Referring to FIG. 2B, the display device DD may be out-folded with respect to the first folding axis FX1. The display device DD may display the image IM in case that the first non-folding region NFA1 of the display surface IS and the second non-folding region NFA2 of the display surface IS are exposed to the outside. The folding region FA1 of the display surface IS exposed to the outside may also display the image IM. As illustrated in FIG. 1, the display device DD may display the image IM when unfolded, and as illustrated in FIG. 2B, the display device DD may also display the image IM when out-folded. The first non-folding region NFA1, the second non-folding region NFA2, and the folding region FA1 may respectively display images providing information independent of each other or may respectively display parts of an image providing single information.

The display device DD according to an embodiment may be manufactured to be able to be in-folded and out-folded, or either in-folded or out-folded.

Figure 3A:
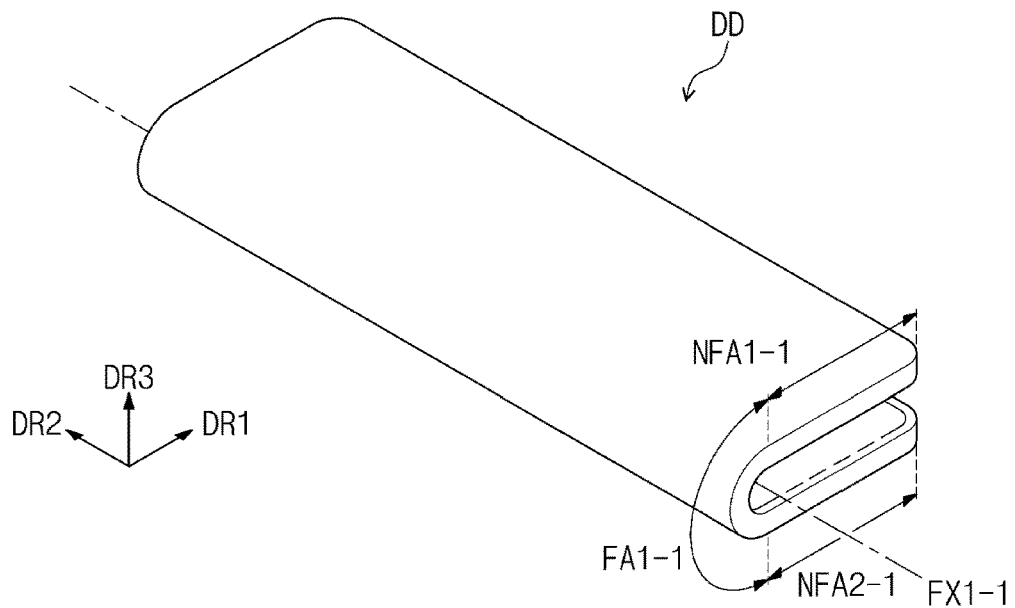
FIG. 3A and FIG. 3B are schematic perspective views of a folded state of a display device according to an embodiment.
Figure 3B:
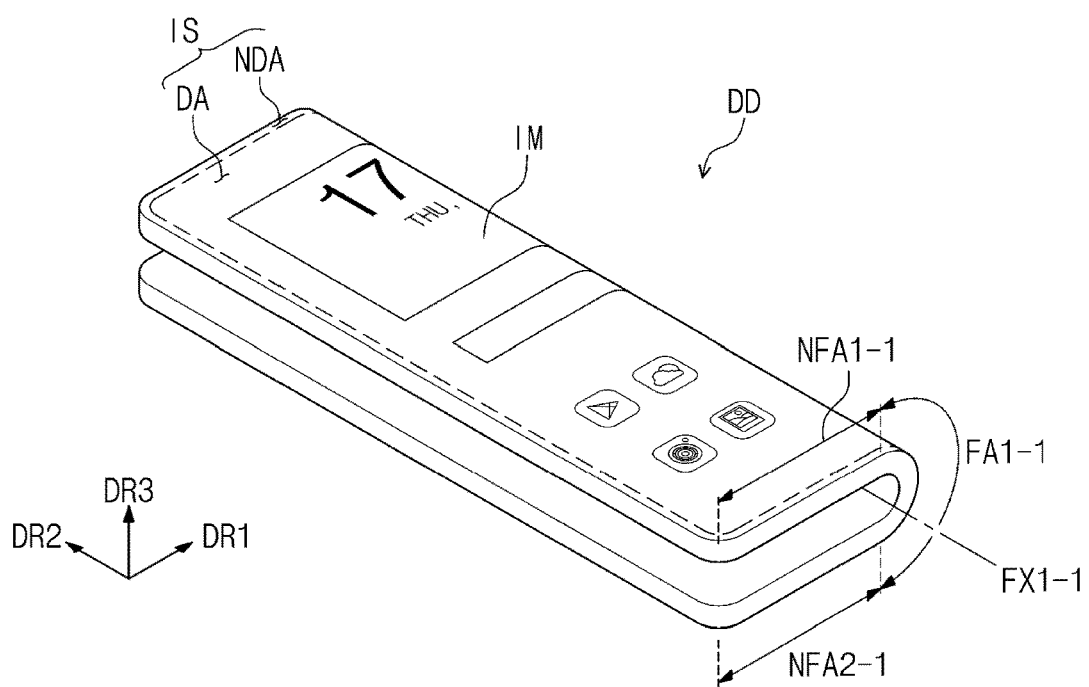

FIGS. 3A and 3B are schematic perspective views of a folded state of a display device according to an embodiment. FIG. 3A is a view illustrating that the display device illustrated in FIG. 1 is in-folded along a second folding axis, and FIG. 3B is a view illustrating that the display device illustrated in FIG. 1 is out-folded along the second folding axis.

Referring to FIGS. 3A and 3B, the display device DD may be in-folded or out-folded with respect to the second folding axis FX1-1. The second folding axis FX1-1 may extend in the first direction DR1, for example, the shorter axis of the display device DD.

The display device DD may include regions depending on an operation type. The regions may be divided into a folding region FA1-1 and one or more non-folding regions NFA1-1 and NFA2-1. The folding region FA1-1 may be defined between the two non-folding regions NFA1-1 and NFA2-1.

The folding region FA1-1 may be a region folded with respect to the second folding axis FX1-1 and may be a region which forms a substantial curvature. The folding region FA1-1 may be folded along the second folding axis FX1-1 and defined as a region extending in the second direction DR2.

As an example, the non-folding regions NFA1-1 and NFA2-1 may include a third non-folding region NFA1-1 and a fourth non-folding region NFA2-1. The third non-folding region NFA1-1 may be adjacent to a side of the folding region FA1-1 in the first direction DR1, and the fourth non-folding region NFA2-1 may be adjacent to the other side of the folding region FA1-1 in the first direction DR1.

In an embodiment, the display device DD is schematically illustrated as having a folding region FA1 or FA1-1, but the embodiments are not limited thereto. In another embodiment, the display device DD may have multiple folding regions. In case that the display device DD have folding regions, each of the folding regions may be in-folded or out-folded along a folding axis defined to overlap each of the folding regions.

Figure 4:
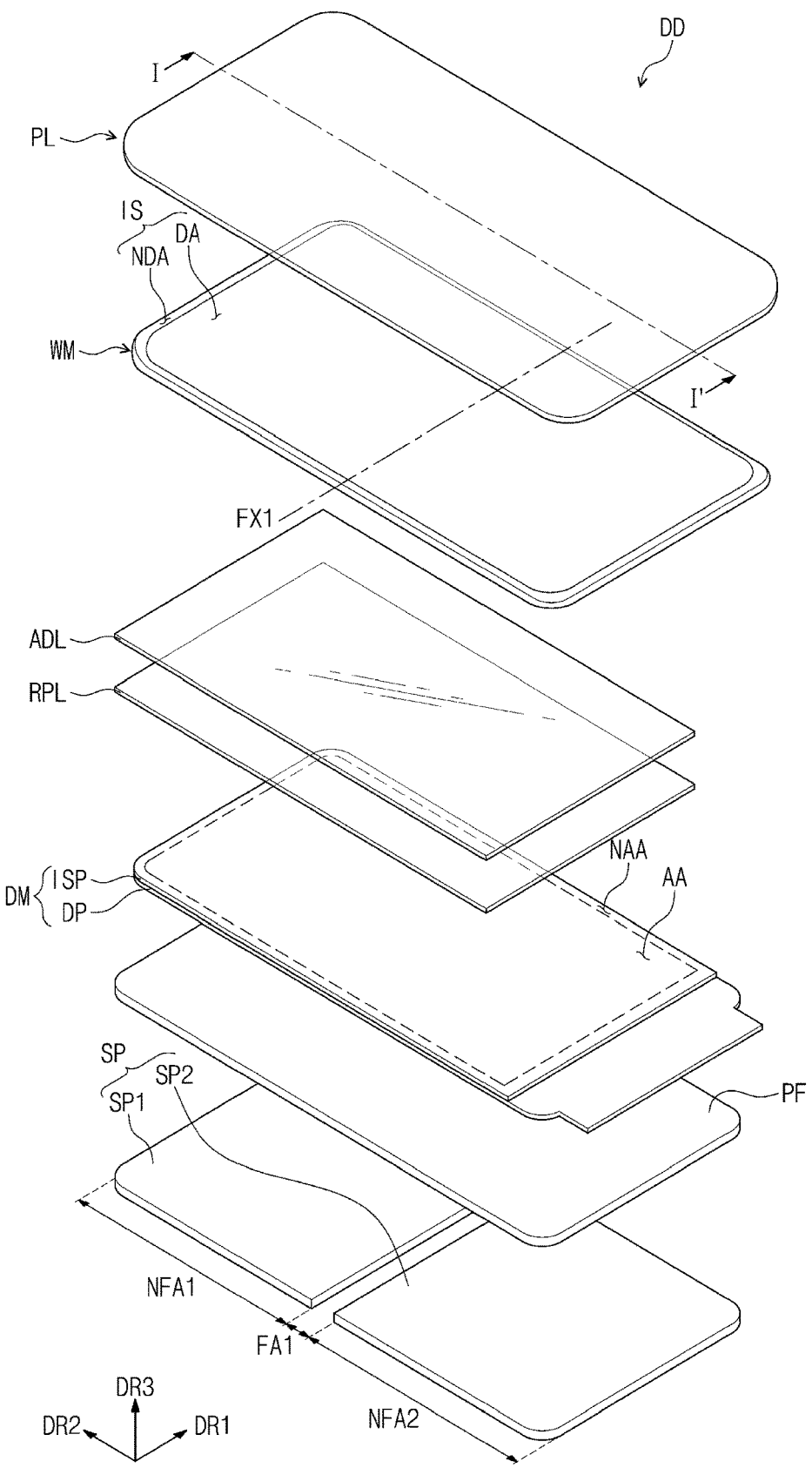
FIG. 4 is a schematic exploded perspective view of a display device according to an embodiment.
Figure 5:
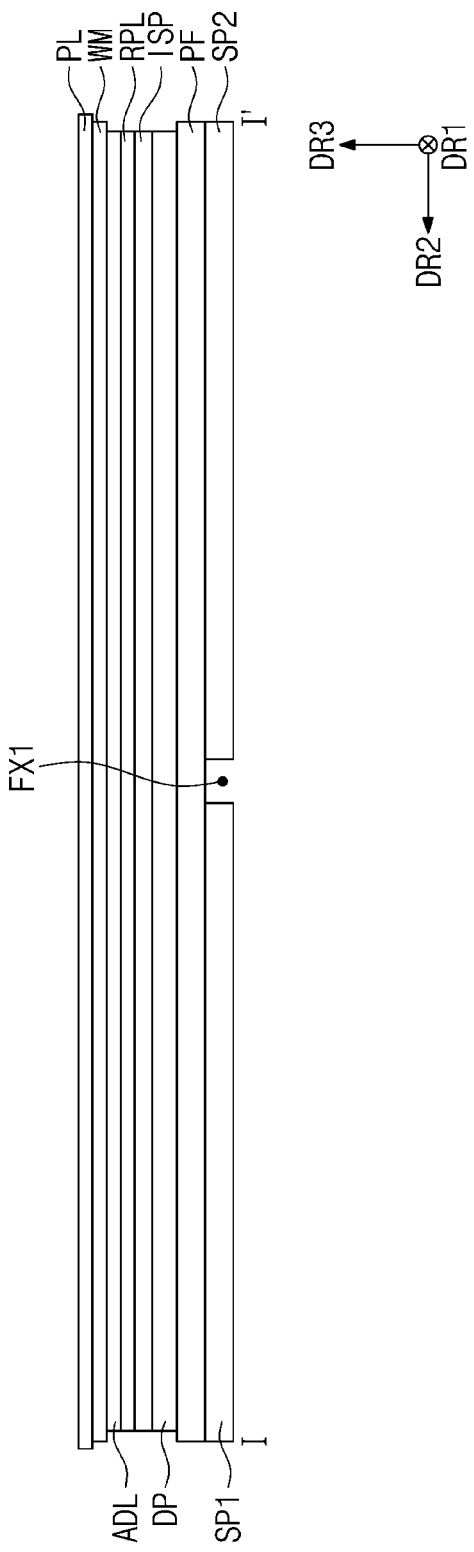
FIG. 5 is a schematic cross-sectional view of a display device according to an embodiment.

FIG. 4 is a schematic exploded perspective view of a display device according to an embodiment. FIG. 5 is a schematic cross-sectional view of a display device according to an embodiment. FIG. 5 illustrates a cross-section taken along line I-I' illustrated in FIG. 4.

Referring to FIGS. 4 and 5, the display device DD according to an embodiment may include a display module DM displaying an image, a window WM disposed on the display module DM, and a protection layer PL disposed on the window WM. The display module DM may form (or constitute) a part of the display device DD (illustrated in FIG. 1), and particularly, may generate an image.

The display module DM may include a display panel DP and an input sensing unit ISP. The display panel DP according to an embodiment may be a light emitting display panel, but the embodiments are not limited thereto. For example, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot, a quantum load, or the like. Hereinafter, the display panel DP may be described as an organic light emitting display panel.

The display panel DP may be a flexible display panel. Accordingly, the display panel DP may be entirely rolled or may be folded or unfolded around the folding axis FX1.

The input sensing unit ISP may be directly disposed on the display panel DP. According to an embodiment, the input sensing unit ISP may be formed on the display panel DP by a series of processes. In case that the input sensing unit ISP is directly disposed on the display panel DP, an adhesive film may not be disposed between the input sensing unit ISP and the display panel DP. However, the embodiments are not limited thereto. An adhesive film may be disposed between the input sensing unit ISP and the display panel DP provided in the form of a panel. In other words, the input sensing unit ISP may not be manufactured by a series of processes with the display panel DP but by a separate process from the display panel DP, and then, may be fixed to an upper surface of the display panel DP using an adhesive film.

The display panel DP may generate an image, and the input sensing unit ISP may obtain coordinate information of a user input (for example, a touch event).

The window WM may be disposed on the display module DM. The window WM may include an optically transparent insulation material. Accordingly, an image generated by the display module DM may be easily recognized by a user through the window WM.

For example, the window WM may include a glass substrate or a synthetic resin film. In case that the window WM is a thin-film glass, the thickness of the window WM may be about 100 μm or less or about 80 μm or less. For example, the thickness of the window WM may be about 45 μm to about 60 but the thickness of the window WM is not limited thereto.

The window WM may include glass, tempered glass, or a synthetic resin film as a base layer and may include a functional layer disposed on an upper and/or lower surface of the base layer. In case that the base layer of the window WM is a synthetic resin film, the window WM may include a polyimide (PI) film or a polyethylene terephthalate (PET) film. The window WM may have a single or multi-layered structure. For example, the window WM may include synthetic resin films connected to each other by an adhesive, or a glass substrate and a synthetic resin film connected to each other by an adhesive. The window WM may be made of a soft material. Accordingly, the window WM may be folded or unfolded around the folding axis FX1. For example, in case that the shape of the display module DM is changed, the shape of the window WM may also be changed. Hereinafter, the configuration of the window WM will be described below in detail.

The window WM may transmit an image from the display module DM and mitigate an external impact, thereby preventing the display module DM from being damaged or malfunctioning by the external impact. The external impact may refer to external force which may be expressed as pressure, stress, or the like and may cause a defect in the display module DM.

The protection layer PL may be disposed on the window WM. The protection layer PL may improve impact resistance properties of the window WM and prevent scattering in case that the window WM is damaged. The protection layer PL may include at least one selected from a urethane-based resin, an epoxy-based resin, a polyester-based resin, a polyether-based resin, an acrylate-based resin, an acrylonitrile-butadiene-styrene (ABS) resin, and rubber. As an example, the protection layer PL may include at least one of phenylene, polyethyleneterephthalate (PET), polyimide (PI), polyamide (PAI), polyethylene naphthalate (PEN), or polycarbonate (PC). In an embodiment, the protection layer PL may be omitted. For example, in the display device DD, a component disposed at an uppermost portion thereof and exposed to the outermost periphery thereof may be the window WM.

One or more functional layers may be disposed between the display module DM and the window WM. As an example, a functional layer may be a reflection prevention layer RPL configured to block external light reflection. The reflection prevention layer RPL may prevent elements forming the display module DM from being visually recognized from the outside because of external light incident through the front surface of the display device DD. The reflection prevention layer RPL may include a phase retarder and a polarizer. The phase retarder may be of a film type or a liquid crystal coating type and may include a $\lambda/2$ phase retarder and/or a $\lambda/4$ phase retarder. The polarizer may also be of a film type or a liquid crystal coating type. The film type polarizer may include a stretchable synthetic resin film, and the liquid crystal coating type polarizer may include liquid crystals arranged in a predetermined arrangement. The phase retarder and the polarizer may be implemented as a single polarizing film.

As another example, the reflection prevention layer RPL may include color filters. The color filters may have a predetermined arrangement. The arrangement of the color filters may be determined in consideration of the light emitting colors of pixels included in the display panel DP. The reflection prevention layer RPL may further include a black matrix adjacent to the color filters.

As another example, the reflection prevention layer RPL may include a destructive interference structure. For example, the destructive interference structure may include a first reflective layer and a second reflective layer disposed on different layers. First reflective light and second reflective light respectively reflected from the first reflective layer and the second reflective layer may be destructively interfered, and accordingly, the reflectance of external light may be reduced.

A functional layer may further include a protection film disposed on an upper portion or a lower portion of the reflection prevention layer RPL.

The reflection prevention layer RPL may be disposed on the input sensing unit ISP. For example, the reflection prevention layer RPL may be disposed between the input sensing unit ISP and the window WM. The reflection prevention layer RPL and the window WM may be connected to each other by an adhesive film ADL. Although not illustrated in the drawings, an adhesive film which fixes the reflection prevention layer RPL to the input sensing unit ISP may further be disposed between the input sensing unit ISP and the reflection prevention layer RPL. Unlike FIG. 4, the input sensing unit ISP may be provided in the form of a separate panel separated from the display panel DP, and the reflection prevention layer RPL may be provided between the input sensing unit ISP and the display module DM.

As an example, the adhesive film ADL may include an optically clear adhesive (OCA) film. However, the adhesive film ADL is not limited thereto and may include an available adhesive or an available pressure-sensitive adhesive. For example, the adhesive film ADL may include an optically clear resin (OCR) or a pressure-sensitive adhesive film (PSA).

The display module DM may display an image according to an electrical signal and may transmit or receive information on an external input. The display module DM may be defined as an active region AA and a peripheral region NAA. The active region AA may be defined as a region which emits an image provided by the display module DM.

The peripheral region NAA may be adjacent to the active region AA. For example, the peripheral region NAA may surround the active region AA. However, this is only an example. The peripheral region NAA may be defined as having various shapes and is not limited to an embodiment. In an embodiment, the active region AA of the display module DM may correspond to at least a portion of the display region DA.

As illustrated in FIGS. 4 and 5, the display device DD may further include a protection film PF disposed on a back surface of the display module DM to protect the display module DM, and a support plate SP disposed on the back surface of the display module DM to support the display module DM. The support plate SP may be a metal plate. The support plate SP may be a stainless steel plate. The strength of the support plate SP may be greater than that of the display module DM.

A number of the support plate SP may correspond to a number of the non-folding regions NFA1 and NFA2. As an example, the support plate SP may include a first support plate SP1 and a second support plate SP2 disposed spaced apart from the first support plate SP1. The first and second support plates SP1 and SP2 may be disposed corresponding to the non-folding regions NFA1 and NFA2. For example, the first support plate SP1 may be disposed corresponding to the first non-folding region NFA1 of the display device DD, and the second support plate SP2 may be disposed corresponding to the second non-folding region NFA2 of the display device DD. In an embodiment, the display device DD may be folded based on the first folding axis FX1, and the first support plate SP1 and the second support plate SP2 may be spaced apart from each other in the second direction DR2 in a non-folded state.

The first and second support plates SP1 and SP2 may be spaced apart corresponding to the folding region FA1. The first and second support plates SP1 and SP2 may partially overlap the folding region FA1 and may not overlap at least a portion of the folding region FA1. For example, in the second direction DR2, the distance between the first support plate SP1 and the second support plate SP2 may be less than the width of the folding region FA1.

The support plate SP may further include a connection module configured to connect the first and second support plates SP1 and SP2. The connection module may include a hinge module or a multi-joint module.

The support plate SP is illustrated as being provided with the two support plates SP1 and SP2, but the embodiments are not limited thereto. For example, as the number of the folding axis FX1 and the folding region FA1 increases, the support plate SP may be provided with support plates spaced apart in folding axes FX1.

FIG. 4 illustrates a structure in which the support plate SP is separated into the first and second support plates SP1 and SP2, but the embodiments are not limited thereto. For example, the support plate SP may be provided in the form of a single plate disposed corresponding to the first non-folding region NFA1, the second non-folding region NFA2, and the folding region FA1. Here, the support plate SP may include holes formed through the support plate SP provided in the folding region FA1 or may include a material having highly stretchable properties in a portion overlapping the folding region FA1.

Between the display module DM and the support plate SP, the protection film PF may be further disposed. The protection film PF may include a polymer material. The protection film PF may be configured to absorb an impact applied from the outside. In an embodiment, the protection film PF may be a cushion layer having high porosity. The protection film PF may be connected to each of the display module DM and the support plate SP by an adhesive film.

As illustrated in FIG. 5, a sidewall of the window WM may be disposed further inside than a sidewall of the protection layer PL. Being disposed further inside may mean being disposed closer to the active region AA. For example, the sidewall of the window WM may not protrude more than the sidewall of the protection layer PL. Therefore, the protection layer PL may block an external impact from being transferred to the sidewall of the window WM, and as a result, the window WM may be less likely to be cracked. The adhesive film ADL may be disposed on the back surface of the window WM, and a sidewall of the adhesive film ADL may be disposed further inside than the sidewall of the window WM. The sidewall of the window WM may protrude more than the sidewall of each of the adhesive film ADL, the reflection prevention layer RPL, the input sensing unit ISP, and the display panel DP disposed on the lower portion of or under the window WM. Thus, the window WM may block an external impact from being transferred to a lower component.

Figure 6A:
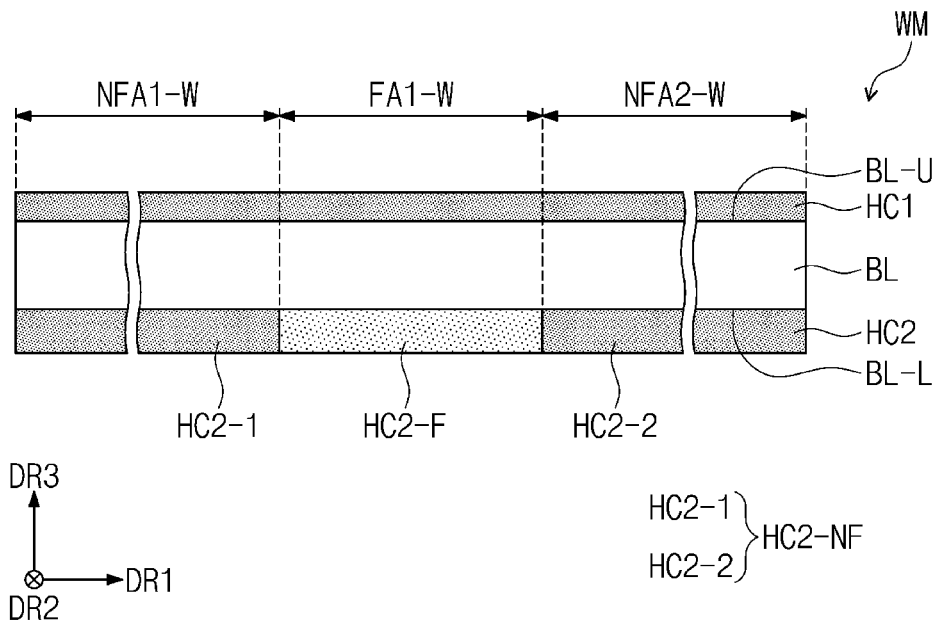
FIG. 6A to FIG. 6C are schematic cross-sectional views of a window included in a display device according to an embodiment.
Figure 6B:
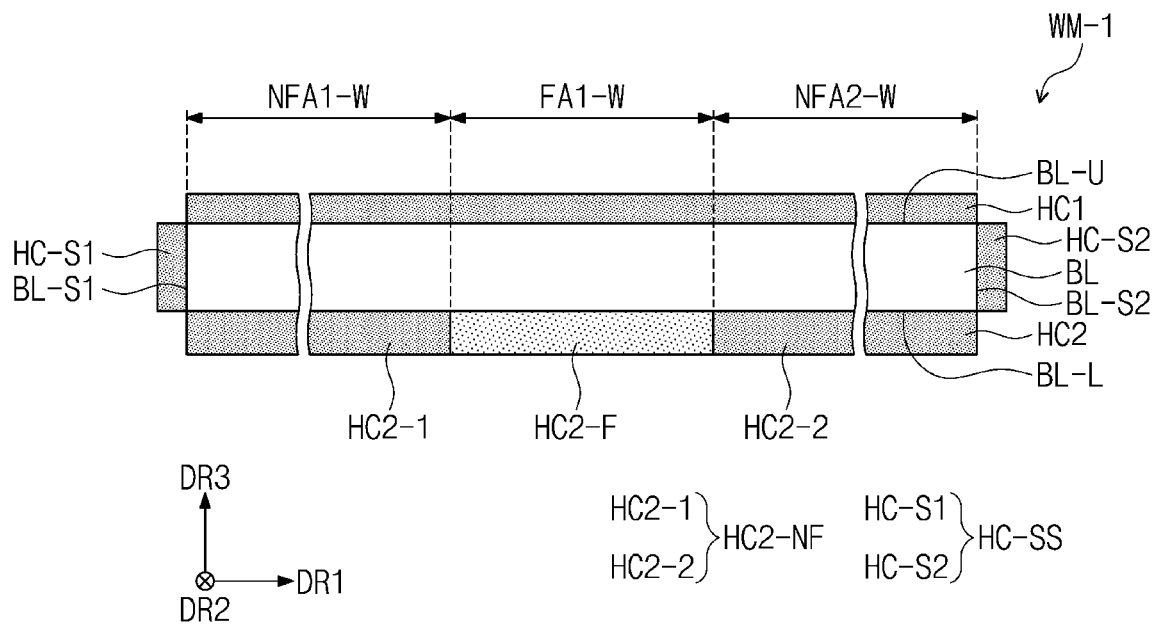
Figure 6C:
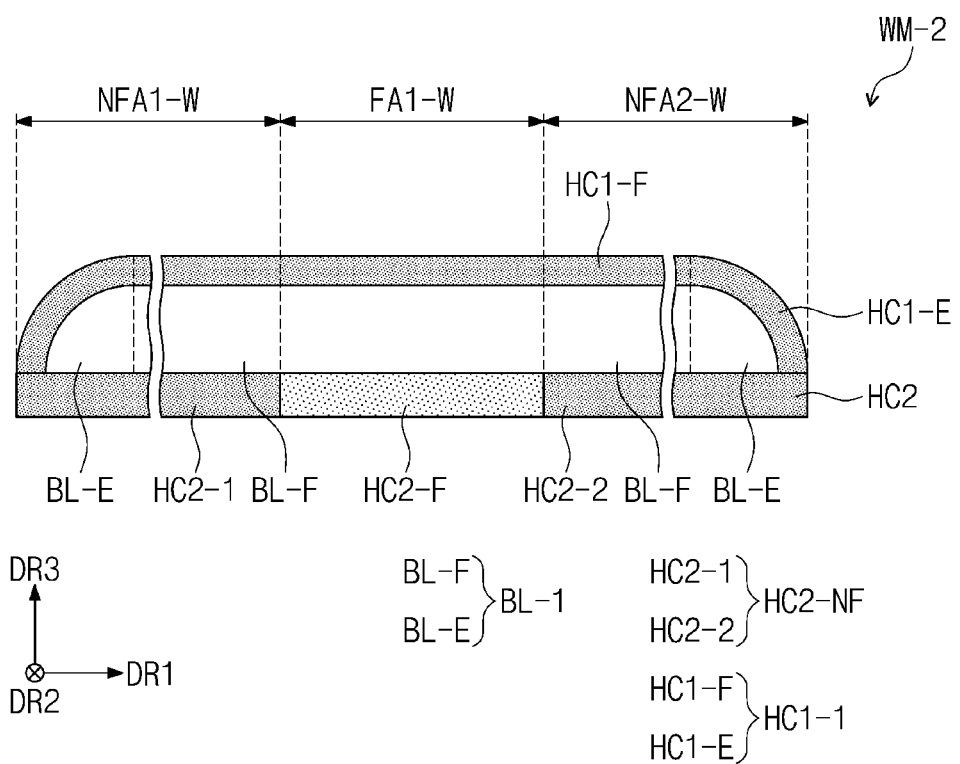

FIGS. 6A to 6C are schematic cross-sectional views of a window included in a display device according to an embodiment.

Referring to FIG. 6A, the window WM according to an embodiment may include a base layer BL and hard coating layers HC1 and HC2 disposed on an upper surface and a lower surface of the base layer BL. The window WM of an embodiment may include a first non-folding region NFA1-W, a folding region FA1-W, and a second non-folding region NFA2-W sequentially defined in the first direction DR1. The first non-folding region NFA1-W of the window WM may be a portion corresponding to the first non-folding region NFA1 of the display device DD, the folding region FA1-W of the window WM may be a portion corresponding to the folding region FA1 of the display device DD, and the second non-folding region NFA2-W of the window WM may be a portion corresponding to the second non-folding region NFA2 of the display device DD. The description of each of the first non-folding region NFA1-W, the folding region FA1-W, and the second non-folding region NFA2-W of the window WM may be identical to that of the first non-folding region NFA1, the folding region FA1, and the second non-folding region NFA2 of the display device DD.

The base layer BL may include a transparent material. In an embodiment, the base layer BL may include glass, tempered glass, or a synthetic resin film. In an embodiment, the base layer BL may be a chemically reinforced glass substrate. In case that the base layer BL is a chemically reinforced glass substrate, the base layer BL may have increased mechanical strength while having a reduced thickness, and thus may be used as a window of a foldable display device. In case that the base layer BL includes a synthetic resin film, the base layer BL may include a polyimide (PI) film or a polyethylene terephthalate (PET) film. The base layer BL of the window WM may have a single- or multi-layered structure. For example, the base layer BL may have a structure in which synthetic resin films are connected by using an adhesive member, or in which a glass substrate and a synthetic resin film are connected by using an adhesive. The base layer BL may be made of a soft material. A thickness of the base layer BL may be, for example, about 20 µm to about 60 µm or about 20 µm to about 40 µm. FIGS. 6A and 6B illustrate an embodiment of the base layer BL having a rectangular shape, but the embodiments are not limited thereto. The base layer BL according to an embodiment may have a shape in which an edge portion of an upper surface BL-U of the base layer BL is rounded with a curved surface. More specifically, the base layer BL may have a shape in which an edge portion of an upper surface thereof overlapping the non-display region NDA (see FIG. 4) is rounded with a curved surface.

On the upper surface and on the lower surface of the base layer BL, the hard coating layers HC1 and HC2 are disposed. The window WM according to an embodiment may include a first hard coating layer HC1 disposed on the upper surface BL-U of the base layer BL and a second hard coating layer HC2 disposed on a lower surface BL-L of the base layer BL. The second hard coating layer HC2 may be a component more adjacent to the lower component of the display device DD (see FIG. 4), for example, the adhesive film ADL, the reflection prevention layer RPL, the display module DM, or the like, than the first hard coating layer HC1.

Each of the first hard coating layer HC1 and the second hard coating layer HC2 may have a high hardness to protect the base layer BL from an impact applied from the outside. For example, at least a portion of each of the first hard coating layer HC1 and the second hard coating layer HC2 may have a pencil hardness of about 6 H or greater.

The first hard coating layer HC1 may be disposed on the upper surface BL-U of the base layer BL and may have a single film structure which is not separated into regions. The second hard coating layer HC2 may be disposed on the lower surface BL-L of the base layer BL and may include a first portion HC2-NF disposed in the non-folding regions NFA1-W and NFA2-W and a second portion HC2-F overlapping the folding region FA1-W. The first portion HC2-NF may include a first non-folding portion HC2-1 overlapping the first non-folding region NFA1-W and a second non-folding portion HC2-2 overlapping the second non-folding region NFA2-W. The first portion HC2-NF and the second portion HC2-F may be combined to form the second hard coating layer HC2, which is a single layer film. The first portion HC2-NF and the second portion HC2-F may have substantially the same thickness, and an upper surface of each of the first portion HC2-NF and the second portion HC2-F may be aligned to form a plane. In the disclosure, the phase "substantially the same" may refer that the thickness, constituent materials, concentration, and the like of components are not only completely the same but also the same in a range including differences which may be caused by process errors despite the same design.

The second portion HC2-F may be a portion having a lower hardness than the first portion HC2-NF. In an embodiment, the second portion HC2-F may include a highly stretchable polymer material having a high elongation and thus may have a lower hardness than the first portion HC2-NF. The second portion HC2-F may be a portion having a lower Modulus than the first portion HC2-NF. In the second hard coating layer HC2 of an embodiment, the second portion HC2-F may include a highly stretchable polymer material, and the first portion HC2-NF may not include a highly stretchable polymer material. The second portion HC2-F may include at least one of a urea-based material, a urethane-based material, an ester-based material, or an epoxy-based material. The second portion HC2-F may include at least one of polyurea, polyurethane, polyester, or polyepoxy.

Each of the first hard coating layer HC1 and the second hard coating layer HC2 may include a siloxane compound. Each of the first hard coating layer HC1 and the second hard coating layer HC2 may include a siloxane compound as a main binder. In an embodiment, each of the first hard coating layer HC1 and the second hard coating layer HC2 may include a material such as polymethylsiloxane and polydimethylsiloxane. In an embodiment, the siloxane compound included in each of the first hard coating layer HC1 and the second hard coating layer HC2 may be a siloxane polymer compound or a siloxane oligomer derived from a siloxane monomer having a functional group such as an acrylate group at the terminal thereof. In an embodiment, the siloxane compound may be a siloxane polymer formed by the polymerization of silsesquioxane and a siloxane monomer. The first hard coating layer HC1 may include a siloxane compound, and each of the first portion HC2-NF and the second portion HC2-F of the second hard coating layer HC2 may include a siloxane compound.

Each of the first hard coating layer HC1 and the second hard coating layer HC2 may further include a filler.

The filler may include one of a sol including inorganic particles, a nanosilica sol, and a porous sol. The filler may be spherical and may have substantially a monodispersed size distribution, or a polydisperse distribution obtained by mixing particles having a monodisperse distribution. For example, the average size of the particles included in the filler may be about 10 nm to about 50 nm. The average size of the particles included in the filler may represent the average diameter of the filler. For example, the average size of the particles included in the filler may be about 10 nm to about 30 nm.

In an embodiment, in case that the average size of the particles included in the filler is greater than about 50 nm, the optical transparency of a hard coating layer made of a hard coating composition may be reduced. In addition, in case that the average size of the particles included in the filler is less than about 10 nm, the effect of improving the surface hardness on a hard coating layer may be reduced.

The particles included in the filler may be, for example, $SiO_2$, $TiO_2$, $Al_2O_3$, $ZrO_2$, ZnO, AlN, $Si_3N_4$, or a combination thereof. For example, the particles may include at least one of $SiO_2$, $TiO_2$, $Al_2O_3$, $ZrO_2$, ZnO, AlN, or $Si_3N_4$. In an embodiment, the hard coating composition may include surface-treated $ZrO_2$ particles. As another example, the particles included in the filler may include nano silica particles or porous inorganic particles. In an embodiment, each of the first hard coating layer HC1 and the second hard coating layer HC2 may include a filler including multiple particles, and thus, a hard coating layer with an improved surface hardness and strength may be formed.

Each of the first hard coating layer HC1 and the second hard coating layer HC2 may further include at least one of an anti-foaming agent or a planarization agent.

The anti-foaming agent may be a material having low surface tension and may be a material to remove bubbles generated during the formation of the first hard coating layer HC1 and the second hard coating layer HC2. In an embodiment, the anti-foaming agent may include a siloxane-based material. For example, the anti-foaming agent may include octamethylcyclotetrasiloxane.

The planarization agent may be a material having low surface tension and may be a material to improve the uniformity of a film, thereby improving the film properties of the first hard coating layer HC1 and the second hard coating layer HC2, which are the leveling properties during the formation of the first hard coating layer HC1 and the second hard coating layer HC2. In an embodiment, the planarization agent may include a siloxane-based material. For example, the planarization agent may include dimethylsiloxane.

Each of the first hard coating layer HC1 and the second hard coating layer HC2 may have a refractive index of about 1.3 to about 1.6. Each of the first hard coating layer HC1 and the second hard coating layer HC2 may have a refractive index of about 1.45 to about 1.5. A difference in refractive index between each of the first hard coating layer HC1 and the second hard coating layer HC2 and the base layer BL may be less than about 0.5. Since the difference in refractive index between each of the first hard coating layer HC1 and the second hard coating layer HC2 and the base layer BL is less than about 0.5, the low-reflection properties of the window WM may be improved.

The first hard coating layer HC1 disposed at the uppermost portion of the window WM may further include a low-refractive material. The low-refractive material may lower the refractive index of the first hard coating layer HC1. Since the first hard coating layer HC1 may further include the low-refractive material, the low-reflection properties of the display device DD (see FIG. 1) may be improved.

Although not illustrated, the first hard coating layer HC1 disposed at the uppermost portion of the window WM may further include an additional coating layer disposed thereon. In an embodiment, the additional coating layer may further include an adhesion enhancement layer including perhydropolysilazane (PHPS). In an embodiment, the additional coating layer may further include a fingerprint prevention layer including a hydrophobic material.

The window WM of the display device according to an embodiment includes the first hard coating layer HC1 made of a hard coating material formed on an upper portion thereof and includes the second hard coating layer HC2 made of a hard coating material formed on a lower portion thereof. The second portion HC2-F overlapping the folding region FA1-W of the second hard coating layer HC2 may include a highly stretchable polymer material. Accordingly, the surface hardness of the window WM may be maintained high, so that a display device DD which is robust against an external impact may be provided. The second portion HC2-F overlapping the folding region FA1-W and made of the highly stretchable polymer material secures flexibility through the highly stretchable polymer material, so that the window WM may be used as a window of a flexible display device.

Referring back to FIG. 6A, the first hard coating layer HC1 may have a thickness of about 5 μm to about 15 or about 5 μm to about 10 The second hard coating layer HC2 may have a thickness of about 10 μm to about 40 μm or about 10 μm to 30 μm. In case that the thickness of each of the first hard coating layer HC1 and the second hard coating layer HC2 does not meet a lower limit of the above range, the surface hardness of the window WM may deteriorate, and thus cracks or the like may be caused by an external impact. In case that the thickness of each of the first hard coating layer HC1 and the second hard coating layer HC2 does not meet an upper limit of the above range, the flexibility of the window WM may deteriorate.

In an embodiment, the first hard coating layer HC1 may include a first binder and a filler. The first binder may be the above-described siloxane compound. The first portion HC2-NF of the second hard coating layer HC2-NF may include a first binder and a filler. The second portion HC2-F of the second hard coating layer HC2-NF may include a first binder, a second binder, and a filler. The second binder may be the above-mentioned highly stretchable polymer material.

Referring to FIG. 6B, a window WM-1 according to an embodiment may further include a third hard coating layer HC-SS disposed on side surfaces BL-S1 and BL-S2 of the base layer BL. The third hard coating layer HC-SS may include a first sub-hard coating layer HC-S1 disposed on a first side surface BL-S1 of the base layer BL and a second sub-hard coating layer HC-S2 disposed on a second side surface BL-S2 of the same. Although not illustrated, the base layer BL may further include a third side surface and a fourth side surface spaced apart in the second direction DR2 in addition to the first side surface BL-S1 and the second side surface BL-S2 spaced apart in the first direction DR1, and the third hard coating layer HC-SS may further include a third sub-hard coating layer and a fourth sub-hard coating layer respectively disposed on the third side surface and the fourth side surface.

The third hard coating layer HC-SS and the first hard coating layer HC1 may include the same materials. For example, the third hard coating layer HC-SS may include a siloxane compound and a filler. The third hard coating layer HC-SS may further include at least one of an anti-foaming agent or a planarization agent. The description of each material included in the third hard coating layer HC-SS may be the same as the above-mentioned description.

The third hard coating layer HC-SS may have a thickness of about 5 µm to about 15 µm or about 5 µm to about 10 µm. In case that the thickness of the third hard coating layer HC-SS does not meet a lower limit of the above range, cracks or the like may be caused by an external impact occurred at an outer periphery portion of the window WM-1. In case that the thickness of the third hard coating layer HC-SS does not meet an upper limit of the above range, the side width of the window WM-1 increases, so that a bezel region of the display device may increase.

Referring to FIG. 6C, a window WM-2 according to an embodiment may have a shape in which an edge portion thereof is rounded with a curved surface. For example, a base layer BL-1 included in the window WM-2 may include a flat portion BL-F positioned in a central portion of the window WM-2 and an edge portion BL-E positioned in an edge portion of the window WM-2. The edge portion BL-E may overlap a portion of the first non-folding region NFA1-W and the second non-folding region NFA2-W, and an outer surface of the edge portion BL-E may include a curved surface having a curvature. The edge portion BL-E may have a shape in which the thickness thereof decreases toward the outer periphery of the window WM-2 in a direction parallel to the first direction DR1.

A first hard coating layer HC1-1 may be disposed on an upper surface of the base layer BL-1 and may cover or overlap both the flat portion BL-F and the edge portion BL-E of the base layer BL-1. The first hard coating layer HC1-1 may include a flat hard coating layer HC1-F disposed on an upper surface of the flat portion BL-F of the base layer BL-1 and an edge hard coating layer HC1-E disposed on an upper surface of the edge portion BL-E of the same. The edge hard coating layer HC1-E may entirely overlap a rounded edge portion of the base layer BL-1 of the window WM-2. As illustrated in FIG. 6C, a portion of the edge hard coating layer HC1-E may contact the second hard coating layer HC2. Each of the flat hard coating layer HC1-F and the edge hard coating layer HC1-E may have a thickness of about 5 µm to about 10 µm.

As illustrated in FIGS. 6B and 6C, the windows WM-1 and WM-2 according to an embodiment may include the third hard coating layer HC-SS which overlap a side surface of the base layer BL of the window WM-1, or may include the edge hard coating layer HC1-E which overlap a rounded edge of the base layer BL-1 of the window WM-2. Accordingly, it is possible to prevent generation of cracks on the windows WM-1 and WM-2 caused by an external impact and the like occurred at an outer periphery portion of the display device of an embodiment.

FIGS. 7A to 7D are schematic cross-sectional views sequentially illustrating a method for manufacturing a window used in a display device according to an embodiment. Hereinafter, in describing a method for manufacturing a window according to an embodiment with reference to FIGS. 7A to 7D, the same reference numerals are given to the same components as those described above, and detailed descriptions thereof will be omitted.

The method for manufacturing a window according to an embodiment may include preparing the base layer BL, forming a first hard coating layer, and forming a second hard coating layer.

Figure 7A:
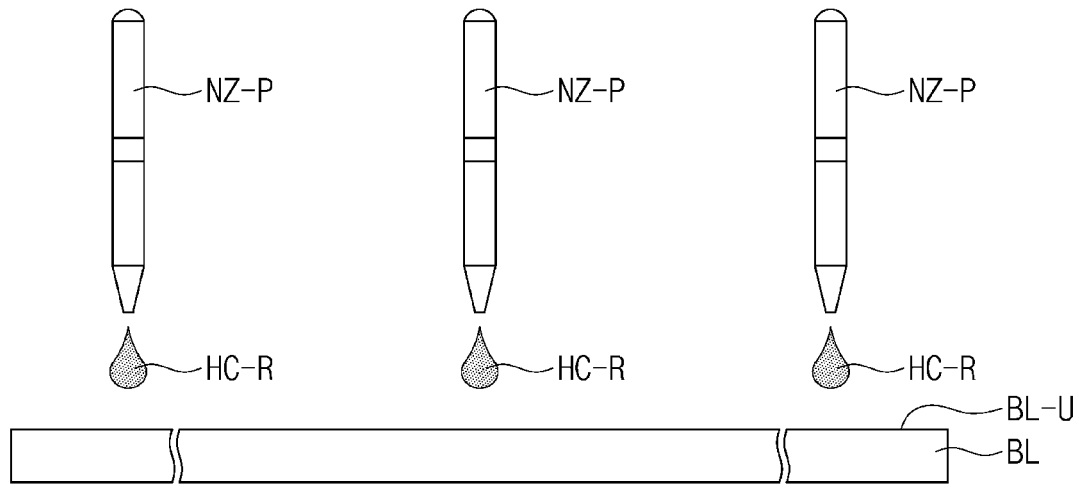
FIG. 7A to FIG. 7D are schematic cross-sectional views sequentially illustrating a method for manufacturing a window used in a display device according to an embodiment.
Figure 7B:
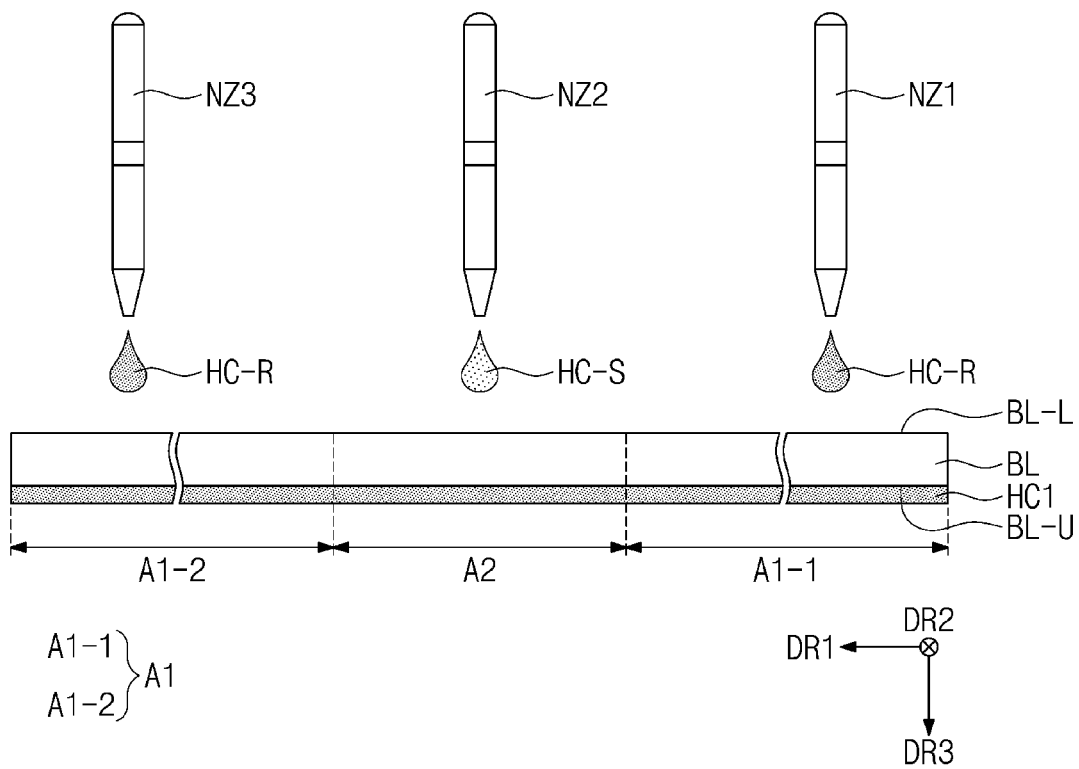

Referring to FIGS. 7A and 7B, a first hard coating material HC-R may be applied onto the base layer BL to provide the first hard coating layer HC1. The first hard coating material HC-R may be applied onto the upper surface BL-U of the base layer BL.

A first region A1-1, a second region A2, and a third region A1-2 may be sequentially defined on the base layer BL in the first direction DR1. In the base layer BL, the first region A1-1 and the third region A1-2 may correspond to the non-folding regions NFA1-W and NFA2-W of the window WM (see FIG. 6A) which has been manufactured. The first region A1-1 may correspond to the first non-folding region NFA1-W, and the third region A1-2 may correspond to the second non-folding region NFA2-W. In the base layer BL, the second region A2 may correspond to the folding region FA1-W of the window WM which has been manufactured.

The first hard coating material HC-R according to an embodiment may include the materials included in the first hard coating layer HC1 described above. The first hard coating layer HC1 may be derived from the first hard coating material HC-R. In an embodiment, the first hard coating material HC-R may include a siloxane compound and a filler. The first hard coating material HC-R may further include at least one of an anti-foaming agent or a planarization agent. The description of each material included in the first hard coating material HC-R may be the same as the above-mentioned description of the first hard coating layer HC1.

The first hard coating material HC-R may further include a solvent in which the siloxane compound and the filler are dissolved. In an embodiment, as the solvent of the first hard coating material HC-R, a solvent commonly known as a solvent of a composition for forming a coating layer may be used without limitation. For example, the first hard coating material HC-R may include at least one of propylene glycol methyl ether, propylene glycol methyl ether acetate, or diethylene glycol monobutyl ether. However, the embodiments are not limited thereto. The solvent may be a mixture solvent including at least one of methanol, methyl ethyl ketone (MEK), or isopropyl alcohol.

In an embodiment, the first hard coating material HC-R may further include additives available in the art within a range which does not deteriorate the effect of the first hard coating material HC-R in addition to the above-mentioned additives. For example, in an embodiment, the first hard coating material HC-R may further include an additive such as a surfactant and an antioxidant.

A method for applying the first hard coating material HC-R is not particularly limited. Various coating methods commonly known in the art may be used. For example, various methods such as spin coating, dip coating, spray coating, slit coating, and roll-to-roll coating may be used, but the embodiment is not limited thereto. In an embodiment, the first hard coating material HC-R may be applied onto the upper surface BL-U of the base layer BL through spray coating.

On the upper surface BL-U of the base layer BL, the first hard coating material HC-R may be applied onto the first region A1-1, the second region A2, and the third region A1-2 through a common nozzle NZ-P. For example, the first hard coating material HC-R may be entirely applied onto the upper surface BL-U of the base layer BL regardless of the first to third regions A1-1, A2, and A1-2.

Although not illustrated, the method for manufacturing a window according to an embodiment may further include pre-processing the upper surface BL-U of the base layer BL before applying the first hard coating material HC-R. The upper surface BL-U of the base layer BL may be surface-treated through a plasma treatment. Through a surface treatment process, the coupling force between the first hard coating layer HC1 and the base layer BL formed through the first hard coating material HC-R may be increased.

Although not illustrated, the method for manufacturing a window according to an embodiment may further include curing the first hard coating material HC-R applied onto the upper surface BL-U of the base layer BL. The first hard coating material HC-R may be subjected to heat curing or ultraviolet curing. As the first hard coating material HC-R applied onto the upper surface BL-U of the base layer BL is cured, the first hard coating layer HC1 may be formed.

Figure 7C:
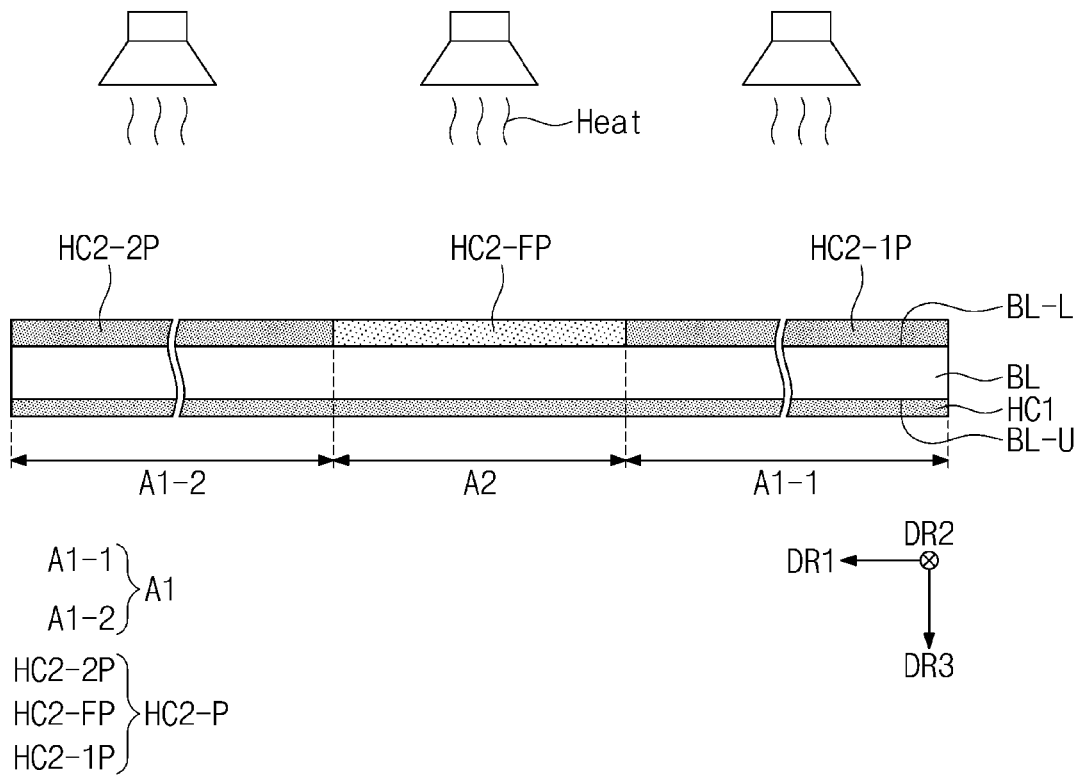
Figure 7D:
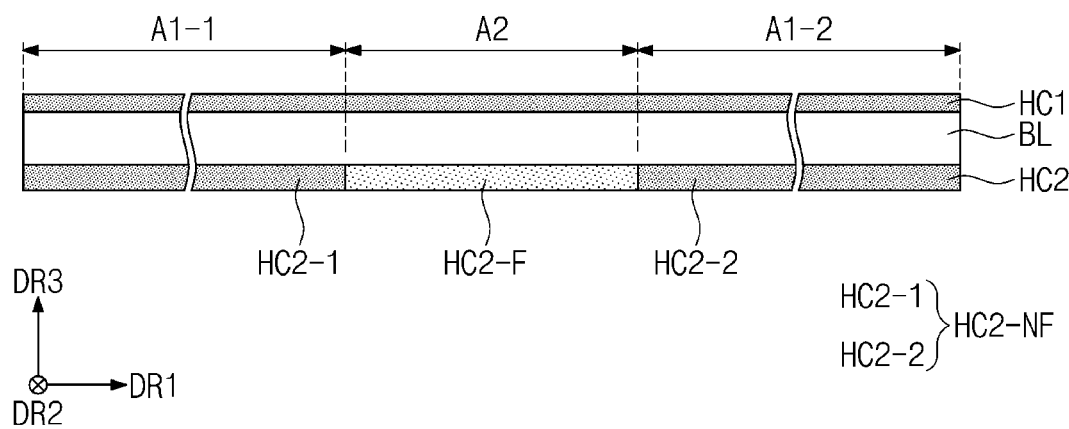

Referring to FIGS. 7B to 7D, the first hard coating material HC-R and a second hard coating material HC-S may be applied onto the base layer BL to form a second hard coating layer. In the forming of the second hard coating layer, the first hard coating material HC-R and the second hard coating material HC-S may be applied onto the lower surface BL-L of the base layer BL.

In the forming of the second hard coating layer, the first hard coating material HC-R may be applied onto the first region A1-1 and the third region A1-2. In the forming of the second hard coating layer, the second hard coating material HC-S may be applied onto the second region A2. The first hard coating material HC-R and the first hard coating material HC-R applied in the forming of the first hard coating layer HC1 described above may be substantially the same material. The first portion HC2-NF of the second hard coating layer HC2 may be derived from the first hard coating material HC-R.

The second hard coating material HC-S may include a material included in the second portion HC2-F of the second hard coating layer HC2 described above. The second portion HC2-F of the second hard coating layer HC2 may be derived from the second hard coating material HC-S. In an embodiment, the second hard coating material HC-S may include a siloxane compound, a highly stretchable polymer material, and a filler. The second hard coating material HC-S may further include at least one of an anti-foaming agent or a planarization agent. The description of each material included in the second hard coating material HC-S may be the same as the above-described description of the second hard coating layer HC2.

The second hard coating material HC-S may further include a solvent in which the siloxane compound, the highly stretchable polymer material, and the filler are dissolved. In an embodiment, as the solvent of the second hard coating material HC-S, a solvent available as a solvent of a composition for forming a coating layer may be used without limitation. For example, in an embodiment, the second hard coating material HC-S may include at least one of propylene glycol methyl ether, propylene glycol methyl ether acetate, or diethylene glycol monobutyl ether. However, the embodiment is not limited thereto. The solvent may be a mixture solvent including at least one of methanol, methyl ethyl ketone (MEK), or isopropyl alcohol.

In an embodiment, the second hard coating material HC-S may further include additives available in the art within a range which does not deteriorate the effect of the second hard coating material HC-S in addition to the above-mentioned additives. For example, in an embodiment, the second hard coating material HC-S may further include an additive such as a surfactant and an antioxidant.

In an embodiment, the second hard coating material HC-S may include a siloxane compound, a highly stretchable polymer material, a solvent, an anti-foaming agent, a planarization agent, and a filler, and may include the siloxane compound of about 70 wt % to about 80 wt %, the highly-stretchable polymer material of about 3 wt % to about 15 wt %, the solvent of about 10 wt % to about 20 wt %, the anti-foaming agent of about 2 wt % to about 3 wt %, the planarization agent of about 0.5 wt % to about 1 wt %, and the filler of about 1 wt % to about 3 wt % based on the total weight. The viscosity of the second hard coating material HC-S may be about 5 cps to about 10 cps. As the weight ratio of each material included in the second hard coating material HC-S satisfies the above range, the second portion HC2-F formed through the second hard coating material HC-S may have desired hardness, desired folding properties, and desired film formability.

In an embodiment, the weight of solids included in the first hard coating material HC-R and the second hard coating material HC-S may be about 20 wt % to about 45 wt % based on the total weight of the first hard coating material HC-R and the second hard coating material HC-S. Since the weight ratio of the solids included in each of the first hard coating material HC-R and the second hard coating material HC-S satisfies the above range, the second hard coating layer HC2 formed through the first hard coating material HC-R and the second hard coating material HC-S may have desired hardness and desired folding properties.

In the forming of a second hard coating layer according to an embodiment, the first hard coating material HC-R may be applied onto the first region A1-1 and the third region A1-2 through a first nozzle NZ1 and a third nozzle NZ3, and the second hard coating material HC-S may be applied onto the second region A2 through a second nozzle NZ2. A step in which the first hard coating material HC-R is applied through the first nozzle NZ1 and the third nozzle NZ3 and a step in which the second hard coating material HC-S is applied through the second nozzle NZ2 may be performed in the same process. For example, as the first nozzle NZ1, the second nozzle NZ2, and the third nozzle NZ3 are moved in the same direction DR2 in the same process, the first nozzle NZ1 and the third nozzle NZ3 may apply the first hard coating material HC-R onto the first region A1-1 and the third region A1-2, and the second nozzle NZ2 may apply the second hard coating material HC-S onto the second region A2.

Although not illustrated, the method for manufacturing a window according to an embodiment may further include pre-processing the lower surface BL-L of the base layer BL before applying the first hard coating material HC-R and the second hard coating material HC-S. The lower surface BL-L of the base layer BL may be surface-treated through a plasma treatment. Through a surface treatment process, the coupling force between the second hard coating layer HC2 and the base layer BL formed through the first hard coating material HC-R and the second hard coating material HC-S may be increased.

The method for manufacturing a window according to an embodiment may further include applying the first hard coating material HC-R and the second hard coating material HC-S onto the lower surface BL-L of the base layer BL to form a second preliminary hard coating layer HC2-P and then curing the second preliminary hard coating layer HC2-P to form the second hard coating layer HC2. The second preliminary hard coating layer HC2-P may include a first preliminary layer HC2-1P overlapping the first region A1-1, a second preliminary layer HC2-FP overlapping the second region A2, and a third preliminary layer HC2-2P overlapping the third region A1-2, and the first preliminary layer HC2-1P, the second preliminary layer HC2-FP, and the third preliminary layer HC2-2P may be cured together in the same process. The second preliminary hard coating layer HC2-P may be cured through heat curing. In an embodiment, the heat curing may be performed for about 25 minutes at about 175° C., and the heat curing step may be performed by a method such as infrared curing or convection curing. However, the embodiments are not limited thereto. The second preliminary hard coating layer HC2-P may be cured by an ultraviolet curing.

Hereinafter, the properties of the window according to an embodiment will be described in detail through specific Experimental Examples and Comparative Examples. However, a window member and a method for manufacturing the window member described in Examples are only an example, and do not limit the scope of the embodiments.

Figure 8A:
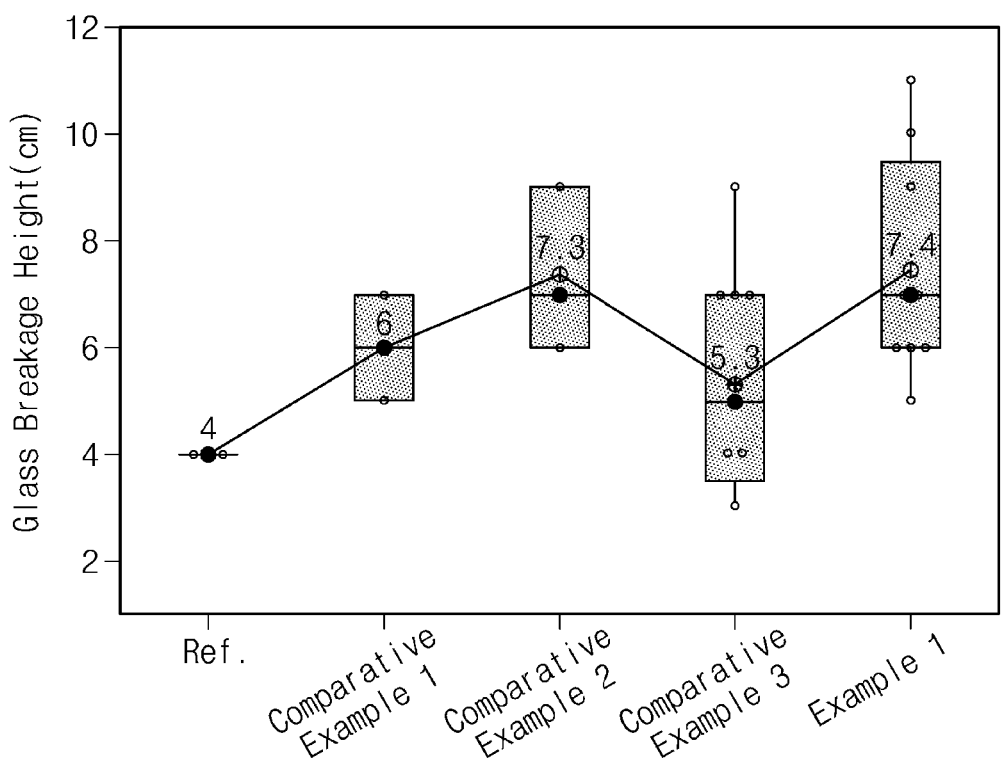
FIG. 8A and FIG. 8B are graphs showing the hardness measurement results of each of Examples and Comparative Examples.
Figure 8B:
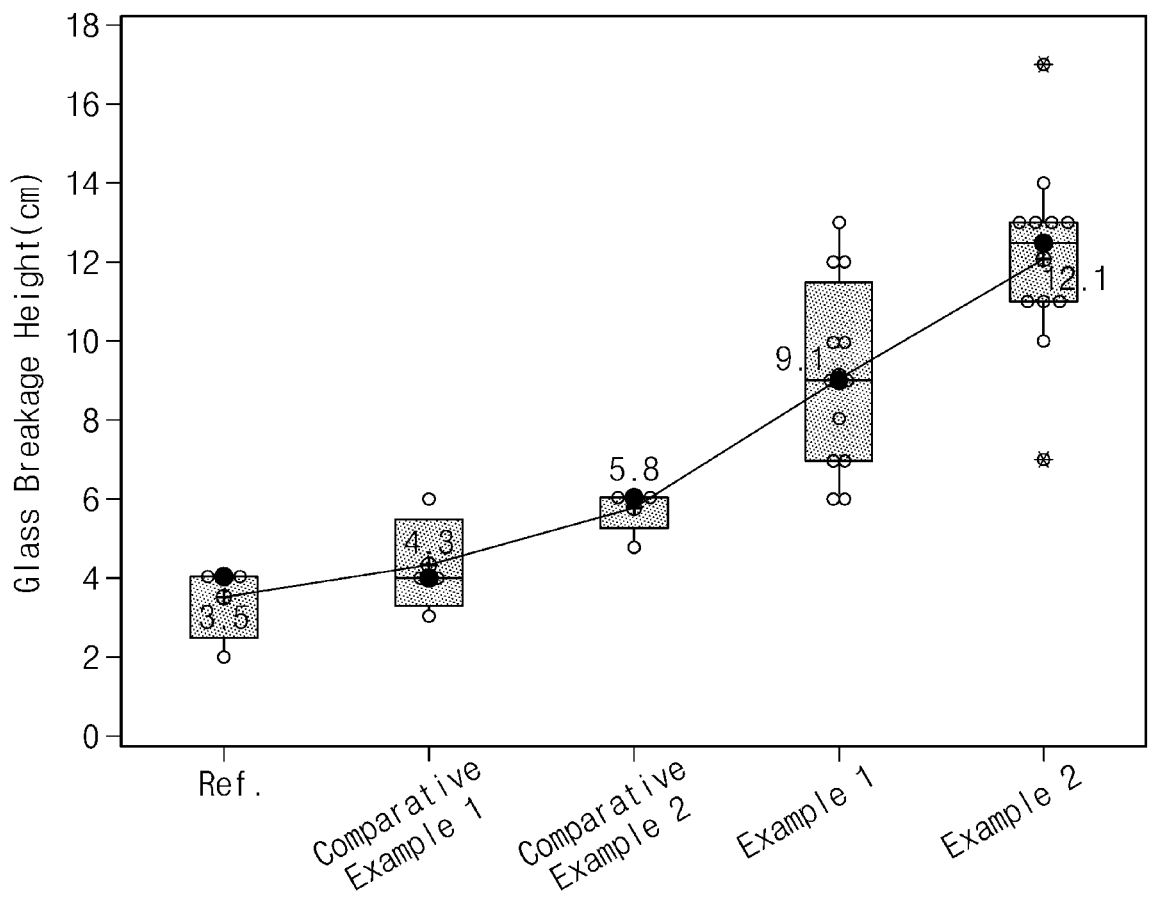

FIGS. 8A and 8B are graphs showing the hardness measurement results of each of Examples and Comparative Examples.

In FIG. 8A, a reference example (Ref.) is the result of a pen drop test on a window not including a hard coating layer. Comparative Example 1 is the result of a pen drop test on a window including a hard coating layer only on an upper surface of a base layer. Comparative Example 2 is the result of a pen drop test on a window including a hard coating layer on an upper surface and a lower surface of a base layer but formed as a single film without a second portion disposed in a folding portion. Comparative Example 3 is the result of a pen drop test on a window including a hard coating layer with a first portion and a second portion only on a lower surface of a base layer. Example 1 is the result of a pen drop test on a window including a first hard coating layer and a second hard coating layer according to an embodiment. Referring to the results of FIG. 8A, it can be seen that the window of Example 1 breaks at an average height of about 7.4 cm from the result of the pen drop test. Accordingly, it can be seen that the window of Example 1 has a high hardness since the breakage occurs at a higher height in the pen drop test than the window (about 4 cm) of Reference Example, the window (about 6 cm) of Comparative Example 1, and the window (about 5.3 cm) of Comparative Example 3. It can be seen that a window having a hardness similar to that of the window (about 7.3 cm) of Comparative Example 2 may be provided.

In FIG. 8B, the reference example (Ref.) is the result of a pen drop test on a window not including a hard coating layer. Comparative Example 1 is the result of a pen drop test on a window having an upper hard coating layer formed of a hard coating material having a solid content of about 25 wt % among windows including a hard coating layer only on an upper surface of a base layer. Comparative Example 2 is the result of a pen drop test on a window having an upper hard coating layer formed of a hard coating material having a solid content of about 35 wt % among windows including a hard coating layer only on an upper surface of a base layer. Example 1 is the result of a pen drop test on a window having a first hard coating layer and a second hard coating layer formed of a hard coating material having a solid content of about 25 wt % among windows including a first hard coating layer and a second hard coating layer according to an embodiment. Example 2 is the result of a pen drop test on a window having a first hard coating layer and a second hard coating layer formed of a hard coating material having a solid content of about 35 wt % among windows including a first hard coating layer and a second hard coating layer according to an embodiment. Referring to the results of FIG. 8B, it can be seen that the window of Example 1 breaks at an average height of about 9.1 cm from the result of the pen drop test, and the window of Example 2 breaks at an average height of about 12.1 cm from the result of the pen drop test. Accordingly, it can be seen that the window of Example 1 has high hardness as the breakage occurs at a higher height in the pen drop test than the window (about 3.5 cm) of Reference Example, the window (about 4.3 cm) of Comparative Example 1, and the window (about 5.8 cm) of Comparative Example 2.

Figure 9A:
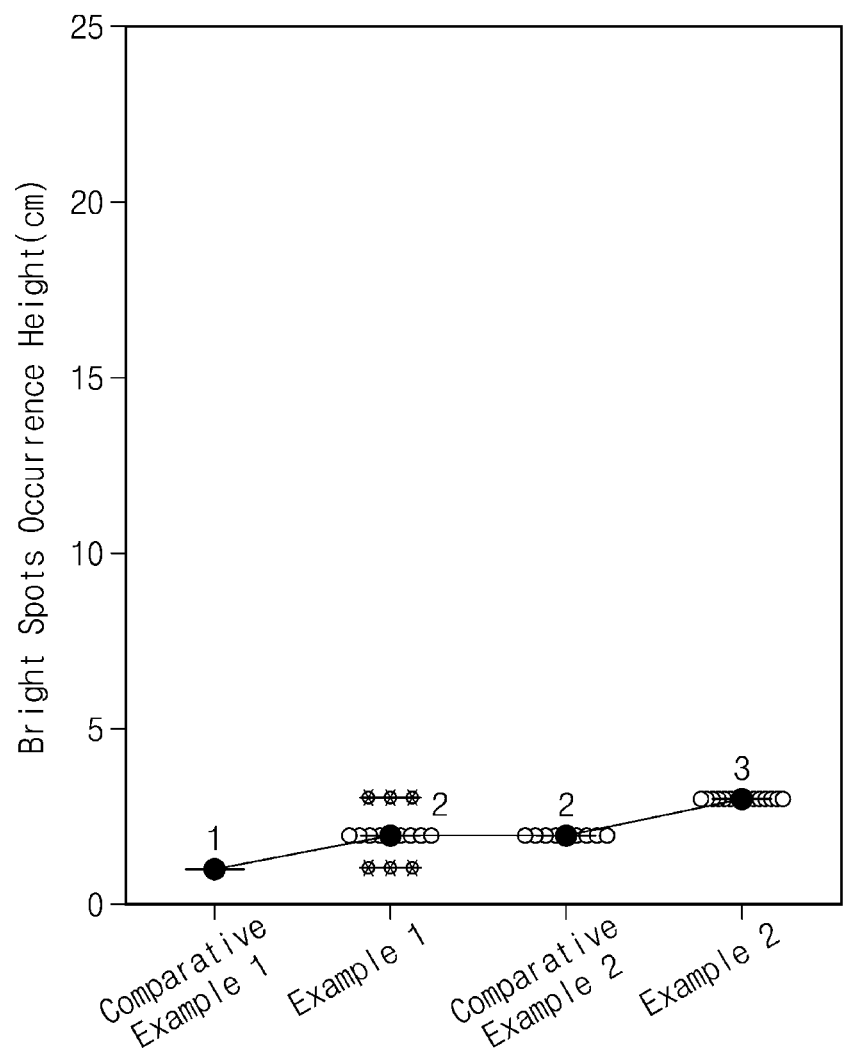
FIG. 9A and FIG. 9B are graphs showing the hardness measurement results of each of Examples and Comparative Examples.
Figure 9B:
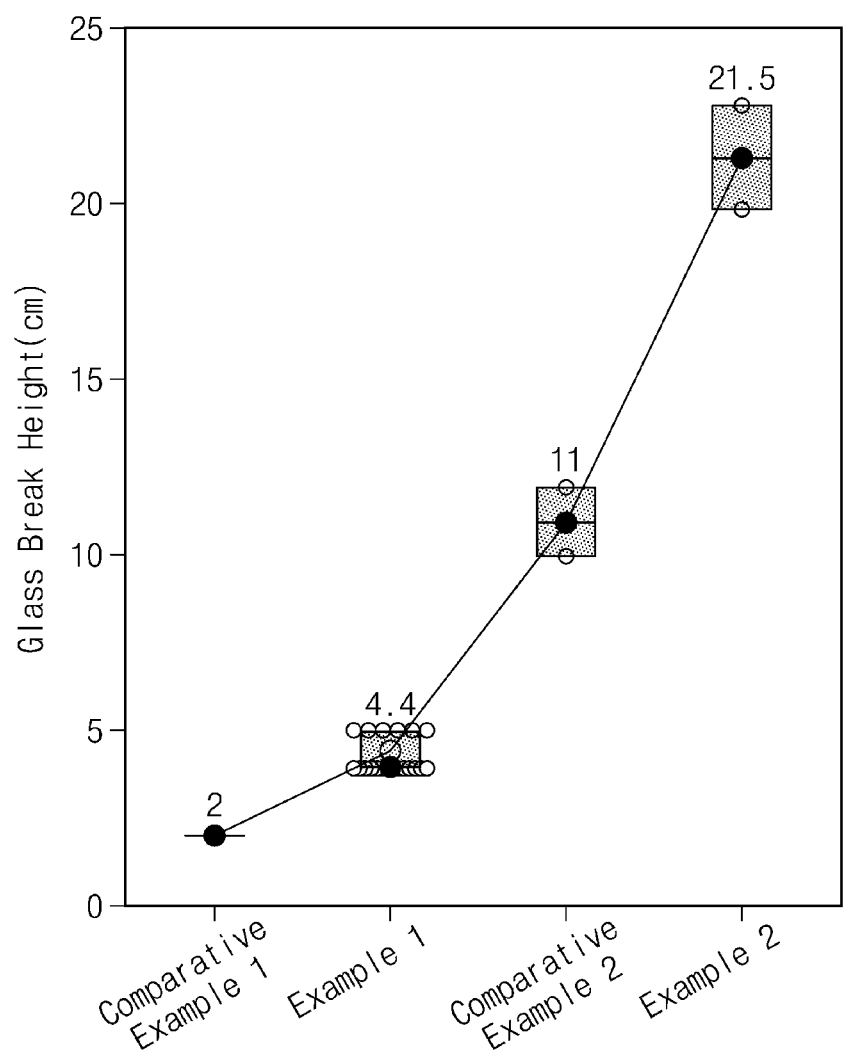

FIGS. 9A and 9B are graphs showing the hardness measurement results of each of Examples and Comparative Examples.

In FIG. 9A, the height at which a bright spot occurs was measured from the results of a pen drop test on windows of Examples and Comparative Examples. In FIG. 9A, Comparative Example 1 is the result of a pen drop test on a window not including a protection layer disposed on the window and a hard coating layer. Comparative Example 2 is the result of a pen drop test on a window including a protection layer disposed on the window but not including a hard coating layer. Example 1 is the result of a pen drop test on a window not including a protection layer disposed on the window but including a hard coating layer according to an embodiment. Example 2 is the result of a pen drop test on a window including a protection layer disposed on the window and a hard coating layer according to an embodiment.

Referring to the results of FIG. 9A, it can be seen that even in case that no protection layer is disposed on the window, the window (about 2 cm) of Example 1 has a higher height at which a bright spot occurs than the window (about 1 cm) of Comparative Example 1, and even in case that there is a protection layer, the window (about 3 cm) of Example 2 has a higher height at which a bright spot occurs than the window (about 2 cm) of Comparative Example 2. For example, the window including the first hard coating layer and the second hard coating layer according to an embodiment may improve the surface hardness regardless of the presence of a protection layer, and thus, may prevent bright spots from occurring.

In FIG. 9B, the height at which the breakage occurs was measured from the results of a pen drop test on windows of Examples and Comparative Examples. In FIG. 9B, Comparative Example 1 is the result of a pen drop test on a window not including a protection layer disposed on the window and a hard coating layer. Comparative Example 2 is the result of a pen drop test on a window including a protection layer disposed on the window but not including a hard coating layer. Example 1 is the result of a pen drop test on a window not including a protection layer disposed on the window but including a hard coating layer according to an embodiment. Example 2 is the result of a pen drop test on a window including a protection layer disposed on the window and a hard coating layer according to an embodiment.

Referring to the results of FIG. 9B, it can be seen that even in case that no protection layer is disposed on the window, the window (about 4.4 cm) of Example 1 has a higher height at which the breakage occurs than the window (about 2 cm) of Comparative Example 1, and even in case that a protection layer is present, the window (about 21.5 cm) of Example 2 has a higher height at which the breakage occurs than the window (about 11 cm) of Comparative Example 2. For example, the window including the first hard coating layer and the second hard coating layer according to an embodiment may improve the surface hardness regardless of the presence of a protection layer, and thus, may prevent breakage from occurring.

Figure 10:
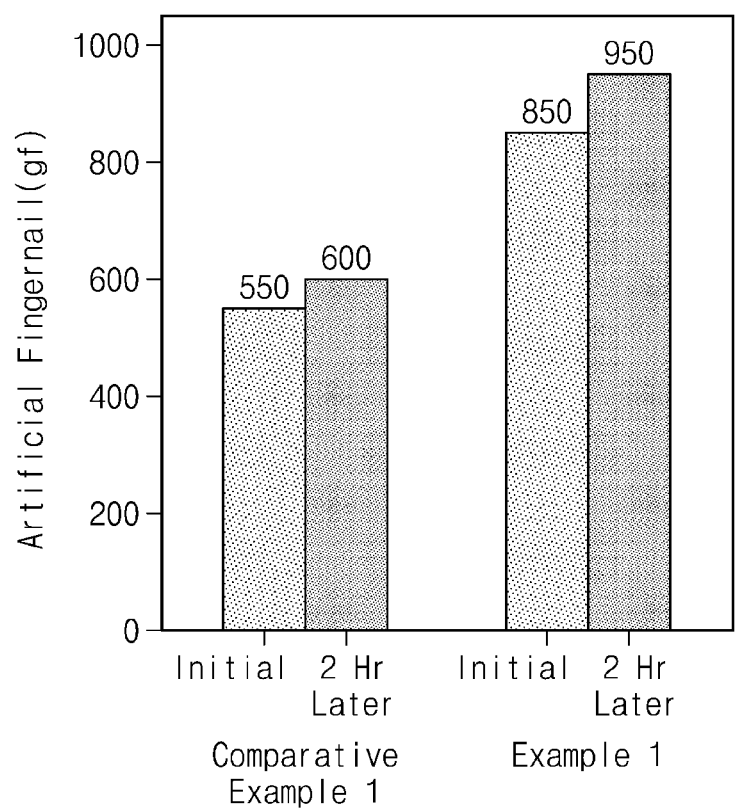
FIG. 10 is a graph showing the surface press and restoration evaluation results of each of Examples and Comparative Examples.

FIG. 10 is a graph showing the results of evaluation of surface press and restoration of each of Examples and Comparative Examples. FIG. 10 illustrates the results of the initial pressing properties evaluation measured after pressing the surface of a window through an artificial fingernail having a hardness of about 2.5 H, and the results of restoration properties evaluation measured 2 hours after the pressing are illustrated. In FIG. 10, Comparative Example 1 is the results of surface pressing and restoration evaluations of a window not including a hard coating layer, and Example 1 is the results of surface pressing and restoration evaluations of a window including a first hard coating layer and a second hard coating layer according to an embodiment.

Referring to the results of FIG. 10, it can be seen that the window (about 850 gf) of Example 1 (Initial) exhibits desired results in the artificial fingernail pressing properties evaluation compared to the window (about 550 gf) of Comparative Example 1 (Initial). It can be seen that the window (about 950 gf) of Example 1 (2 Hr Later) exhibits desired results in the artificial fingernail pressing properties evaluation compared to the window (about 600 gf) of Comparative Example 1 (2 Hr Later). Accordingly, it can be seen that the window including the first hard coating layer and the second hard coating layer according to an embodiment is robust against surface pressing and has improved restoration force after the pressing.

Table 1 below shows the results of folding properties evaluation of each of Examples and Comparative Examples. Table 1 shows whether a defect has occurred in windows of Examples and Comparative Examples after in-folding the windows with a curvature of about 1.5 mm about 30,000 times under a low temperature of about −25° C. According to the results of the evaluation, "OK" means that no defect such as a crack has occurred in the windows, and "NG" means that a defect such as a crack has occurred in the windows before about 30,000 times of repeated folding. Reference Example is the result of the folding properties evaluation of a window not including a hard coating layer. Comparative Example 1 is the result of the folding properties evaluation of a window including a hard coating layer on an upper surface and a lower surface of a base layer and formed as a single film without a second portion disposed in a folding portion. Example 1 is the result of folding properties evaluation of a window including a first hard coating layer and a second hard coating layer according to an embodiment.

TABLE 1

| Window | Reference Example | Comparative Example 1 | Example 1 |
| --- | --- | --- | --- |
| Generation of cracks | OK | NG | OK |

Referring to the results of Table 1, in case that a second portion is not disposed in a folding portion as in Comparative Example 1, for example, in the case of the window including a highly stretchable polymer material, thereby not including a folding portion having low hardness, it can be seen that a defect has occurred during the repeated folding test under the low temperature condition. However, in the case of the window including the first hard coating layer and the second hard coating layer according to an embodiment, it can be seen that no defect has occurred during the repeated folding test under the low temperature condition. In FIGS. 8A to 10A and the test results of Table 1 above, it can be seen that the window including the first hard coating layer and the second hard coating layer according to an embodiment has a high hardness, and thus, is prevented from defects such as cracks or breakage occurring therein even in case that there is an external impact, and is also prevented from defects occurring therein even in the repeated folding test under a reliability condition (low temperature condition). Accordingly, the window may be used in a foldable display device.

According to an embodiment, an upper hard coating layer may be disposed on an upper portion of a window, a lower hard coating layer may be disposed on a lower portion of the window, and a region of the lower hard coating layer which overlaps a folding region may include a highly stretchable polymer thereby having a low hardness, so that a display device having a high surface hardness and impact resistance and desired bending properties may be provided.

Although the disclosure has been described with reference to some embodiments, it will be understood by those skilled in the art that various changes in form and details may be made therein without departing from the spirit and scope of the claimed invention as set forth in the following claims. Accordingly, the technical scope of the disclosure is not intended to be limited to the contents set forth in the detailed description of the specification.

What is claimed is:

1. A display device comprising:
a display module; and
a window which is disposed on the display module and in which a first non-folding region, a folding region, and a second non-folding region are sequentially defined in a first direction, wherein
the window includes:
a base layer;
a first hard coating layer disposed on an upper surface of the base layer; and
a second hard coating layer disposed on a lower surface of the base layer,
the second hard coating layer including:
a first portion overlapping the first non-folding region and the second non-folding region of the window; and
a second portion overlapping the folding region of the window and having a hardness lower than a hardness of the first portion, wherein
the second portion of the second hard coating layer comprises a stretchable polymer material having a high elongation and a low hardness compared to the first portion of the second hard coating layer, and
the first portion and the second portion of the second hard coating layer each comprise a siloxane compound.

2. The display device of claim 1, wherein the second portion of the window comprises a stretchable polymer material.

3. The display device of claim 2, wherein the second portion of the window comprises at least one of a urea-based material, a urethane-based material, an ester-based material, and an epoxy-based material.

4. The display device of claim 1, wherein the second portion of the window comprises a filler.

5. The display device of claim 1, wherein the window comprises a third hard coating layer disposed on a side surface of the base layer.

6. The display device of claim 1, wherein
the base layer comprises glass or tempered glass, and
the base layer has a thickness in a range of about 20 μm to about 40 μm.

7. The display device of claim 1, wherein
a thickness of the first hard coating layer is in a range of about 5 μm to about 15 μm, and
a thickness of the second hard coating layer is in a range of about 10 μm to about 40 μm.

8. The display device of claim 1, wherein each of the first hard coating layer and the second hard coating layer comprises a siloxane compound.

9. The display device of claim 1, wherein each of the first hard coating layer and the second hard coating layer has a refractive index in a range of about 1.3 to about 1.6.

10. The display device of claim 1, wherein the window is foldable with respect to a folding axis extending in a second direction intersecting the first direction.

11. The display device of claim 1, further comprising a protection layer disposed on the window.

12. The display device of claim 1, wherein a thickness of the first portion of the second hard coating layer is substantially the same as a thickness of the second portion of the second hard coating layer.

13. A display device comprising:
a display module; and
a window which is disposed on the display module and in which a first non-folding region, a folding region, and a second non-folding region are sequentially defined in a first direction, wherein
the window includes:
a base layer; and
a lower hard coating layer disposed between the base layer and the display module, and
the lower hard coating layer includes:
a first portion overlapping the first non-folding region and the second non-folding region of the window; and
a second portion overlapping the folding region of the window, the second portion including a stretchable polymer material selected from the group consisting of polyurea, polyurethane, and polyester wherein
the first portion and the second portion of the second hard coating layer each comprise a siloxane compound.

14. The display device of claim 13, wherein
the window comprises an upper hard coating layer spaced apart from the lower hard coating layer,
the base layer is disposed between the upper hard coating layer and the lower hard coating layer, and
each of the upper hard coating layer and the lower hard coating layer comprises a siloxane compound.

15. The display device of claim 14, wherein the second portion of the lower hard coating layer comprises:
a first binder including the siloxane compound;
a second binder including the stretchable polymer material; and
a filler.

16. A method for manufacturing a window, the method comprising:
preparing a base layer in which a first region, a second region, and a third region are sequentially defined in a first direction;
forming a first hard coating layer by applying a first hard coating material onto an upper surface of the base layer; and
forming a second hard coating layer on a lower surface of the base layer,
wherein the forming of the second hard coating layer includes:
applying the first hard coating material onto the first region and the third region of the base layer to form a first portion; and
applying a second hard coating material including a stretchable polymer material onto the second region of the base layer to form a second portion, wherein the first portion and the second portion of the second hard coating layer each comprise a siloxane compound.

17. The method of claim 16, wherein the applying of the first hard coating material and the applying of the second hard coating material are performed by a single process.

18. The method of claim 16, wherein the applying of the second hard coating material comprises, after the applying of the first hard coating material and the applying of the second hard coating material, curing the applied first hard coating material and the applied second hard coating material.

19. The method of claim 16, wherein the stretchable polymer material comprises at least one of polyurea, polyurethane, or polyester.

20. The method of claim 16, wherein a solid content of the second hard coating material is about 20 wt % to about 45 wt %.

21. The method of claim 16, wherein each of the first hard coating material and the second hard coating material comprises at least one of an anti-foaming agent or a planarization agent.

* * * * *